US012720839B2

(12) United States Patent
Chen et al.

(10) Patent No.: US 12,720,839 B2
(45) Date of Patent: Aug. 25, 2026

(54) SEMICONDUCTOR STRUCTURE HAVING SELF-ALIGNED INSULATING FEATURE AND METHODS FOR MANUFACTURING THE SAME

(71) Applicant: TAIWAN SEMICONDUCTOR MANUFACTURING COMPANY, LTD., Hsinchu (TW)

(72) Inventors: Yi-Ren Chen, Hsinchu (TW); Yi-Hsien Chen, Hsinchu (TW); Chun-Ting Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 710 days.

(21) Appl. No.: 18/150,620

(22) Filed: Jan. 5, 2023

(65) Prior Publication Data

US 2024/0234545 A1 Jul. 11, 2024

(51) Int. Cl.
*H10D 64/01* (2025.01)
*H10D 64/27* (2025.01)
*H10P 50/64* (2026.01)

(52) U.S. Cl.
CPC ......... *H10D 64/021* (2025.01); *H10D 64/017* (2025.01); *H10D 64/512* (2025.01); *H10D 64/518* (2025.01); *H10P 50/642* (2026.01)

(58) Field of Classification Search
CPC .. H10D 64/021; H10D 64/017; H10D 64/512; H10D 64/518; H10D 64/015; H10D 30/798; H10D 30/0215; H10D 30/0218; H10D 30/507; H10D 30/024; H10D 30/6213; H10D 30/6219; H10D 64/258;
(Continued)

(56) References Cited

U.S. PATENT DOCUMENTS

2016/0043186 A1* 2/2016 Liu ...................... H10D 64/021
257/401
2019/0165121 A1* 5/2019 Park ................... H10D 30/6211
(Continued)

OTHER PUBLICATIONS

EESemi.com, âProperties of SiO2 and Si3N4 at 300Kâ, 2004 (Year: 2004).*

*Primary Examiner* — Julio J Maldonado
*Assistant Examiner* — Paul A Berry
(74) *Attorney, Agent, or Firm* — Birch, Stewart, Kolasch & Birch, LLP

(57) ABSTRACT

A semiconductor structure includes a substrate, a channel structure, a gate structure, two gate spacers and an insulating feature. The gate structure is disposed on the channel structure, and includes an upper gate portion which is located at a level higher than that of an uppermost surface of the channel structure. The two gate spacers are respectively located at two opposite sides of the upper gate portion, and each of the gate spacers has an upward surface having a concave profile. The insulating feature is disposed over the upper gate portion and against the concave profiles of the gate spacers to have an inverted U-shaped profile. The insulating feature includes a cap portion which is disposed on an upper surface of the upper gate portion and extends beyond an edge of the upper surface of the upper gate portion. Methods for manufacturing the semiconductor structure are also disclosed.

20 Claims, 21 Drawing Sheets

(58) Field of Classification Search
CPC ............... H10D 64/259; H10D 30/663; H10D 30/0273; H10D 30/797; H10D 30/0198; H10D 30/022; H10D 30/0223; H10D 30/0227; H10D 30/0275; H10D 30/601; H10D 30/6713; H10D 86/215; H10D 86/011; H10D 84/853; H10D 84/834; H10D 84/0193; H10D 30/0158; H01L 21/30604; H01L 21/76831; H01L 21/76837; H01L 21/76897; H01L 21/022; H01D 64/256; H10P 50/642; H10P 14/662; H10W 20/076; H10W 20/098; H10W 20/069
See application file for complete search history.

(56) References Cited

U.S. PATENT DOCUMENTS

2020/0058748 A1* 2/2020 Bae ...................... H10D 64/518
2021/0384192 A1* 12/2021 Bae ...................... H10D 64/017
2023/0290843 A1* 9/2023 Guler ................... H10D 30/024

* cited by examiner 2
2
13U(13)
13U(13)
22
22
D2
131
132
LS2
LS2
19A
Z
X
Y

SEMICONDUCTOR STRUCTURE HAVING SELF-ALIGNED INSULATING FEATURE AND METHODS FOR MANUFACTURING THE SAME

BACKGROUND

Transistors are key active components in modern integrated circuits (IC). With rapid development of semiconductor technology, critical dimension (CD) of transistors keeps shrinking and various three-dimensional (3D) transistor structures are springing up, making it possible to integrate a large number of transistors per unit area. To be specific, in each of the transistors, a distance between a gate electrode (MG) and one of contact features (MD) which is disposed on a corresponding one of source/drain features is reduced, so an isolation structure located between the gate electrode and the adjacent contact feature become more critical. Therefore, an isolation structure for advanced node transistors and/or a method for manufacturing the isolation structure is in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
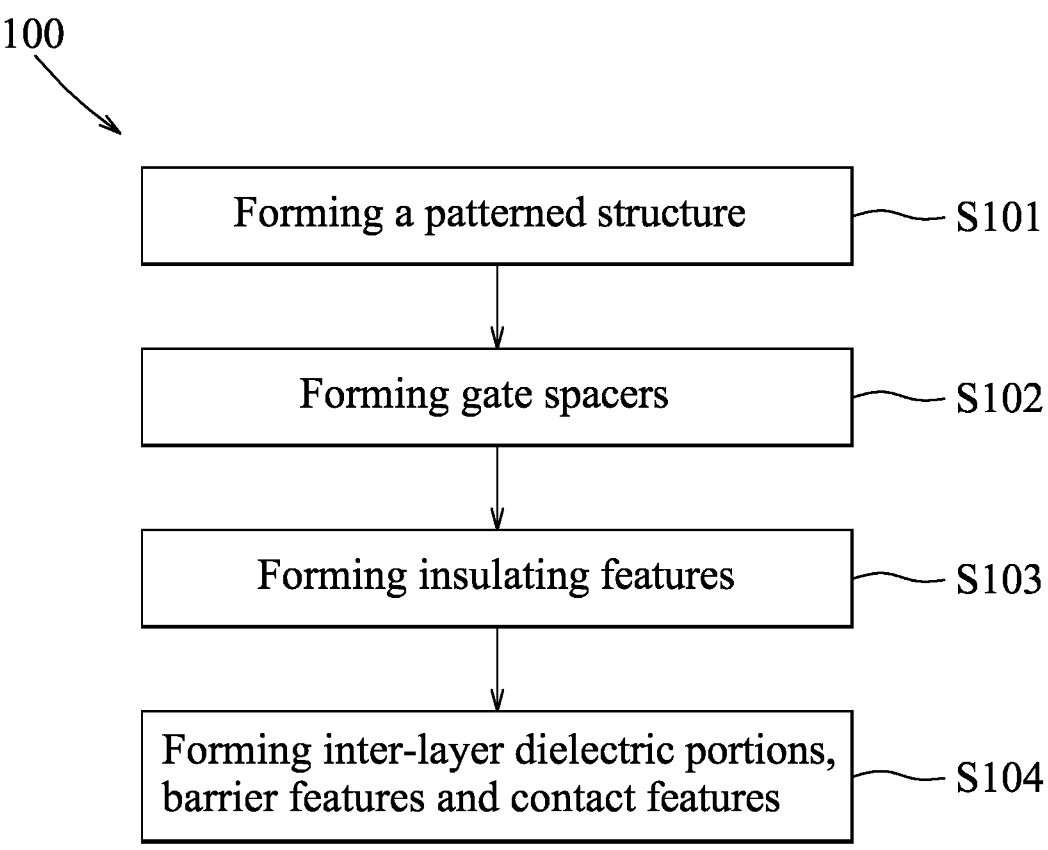
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

For transistors in advanced technology nodes, in order to avoid bridging of one of gate electrodes and an adjacent one of contact features which is disposed on a corresponding one of source/drain features, an isolation structure, such as a silicon nitride-based hard mask, is used to protect an upper surface of each of the gate electrodes, and gate spacers and contact etching stop layers are used to protect lateral surfaces of the gate electrodes. However, along with the dimensional shrinkage of the transistors, a distance between two adjacent ones of the gate electrodes and two adjacent ones of the contact features becomes gradually smaller. When centers of two adjacent ones of the gate electrodes or centers of two adjacent ones of the contact features are separated by a distance less than, for example, but not limited to, about 45 nm, the gate spacers and the contact etching stop layers may be insufficient to prevent one of the gate electrodes from bridging with an adjacent one of the contact features during formation of the contact features. Therefore, the present disclosure is directed to a semiconductor structure having a self-aligned insulating feature and methods for manufacturing the same. The semiconductor structure may be applied to fin-type FETs (FinFET), multi-gate FETs (e.g., gate-all-around FETs (GAAFET), multi-bridge channel FETs (MBCFET), fork-sheet FETs, other three-dimensional transistors, or other suitable devices.

FIG. 1 is a flow diagram illustrating a method 100 for manufacturing a semiconductor structure (for example, a semiconductor structure 3 shown in FIG. 25 or 29) in accordance with some embodiments. FIGS. 2 to 29 illustrate schematic views of intermediate stages of the method 100 in accordance with some embodiments. Some repeating structures are omitted in FIGS. 2 to 29 for the sake of brevity.

Figure 2:
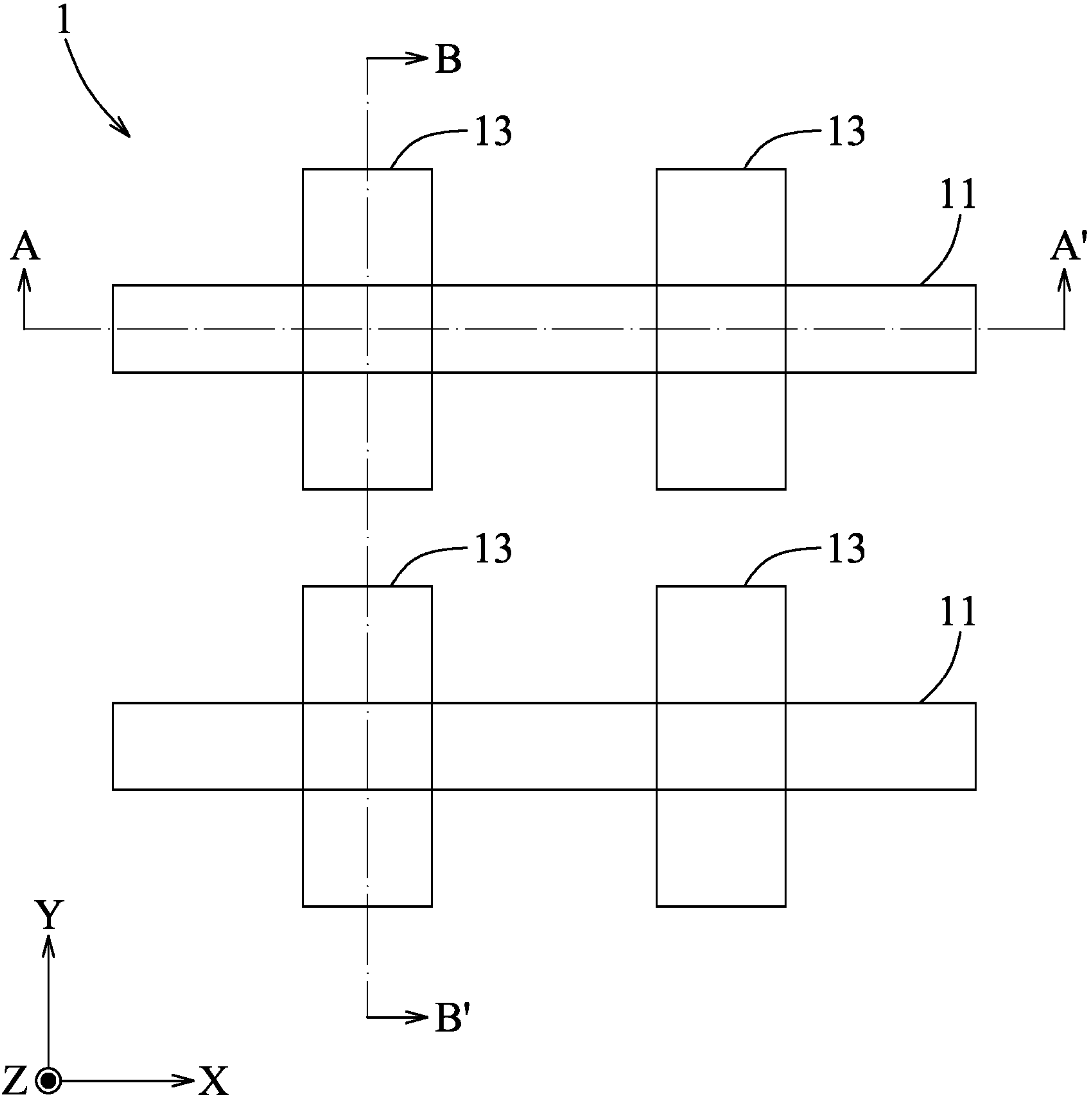
FIGS. 2 to 29 illustrate schematic views of intermediate stages of the method depicted in FIG. 1 in accordance with some embodiments.
Figure 3:
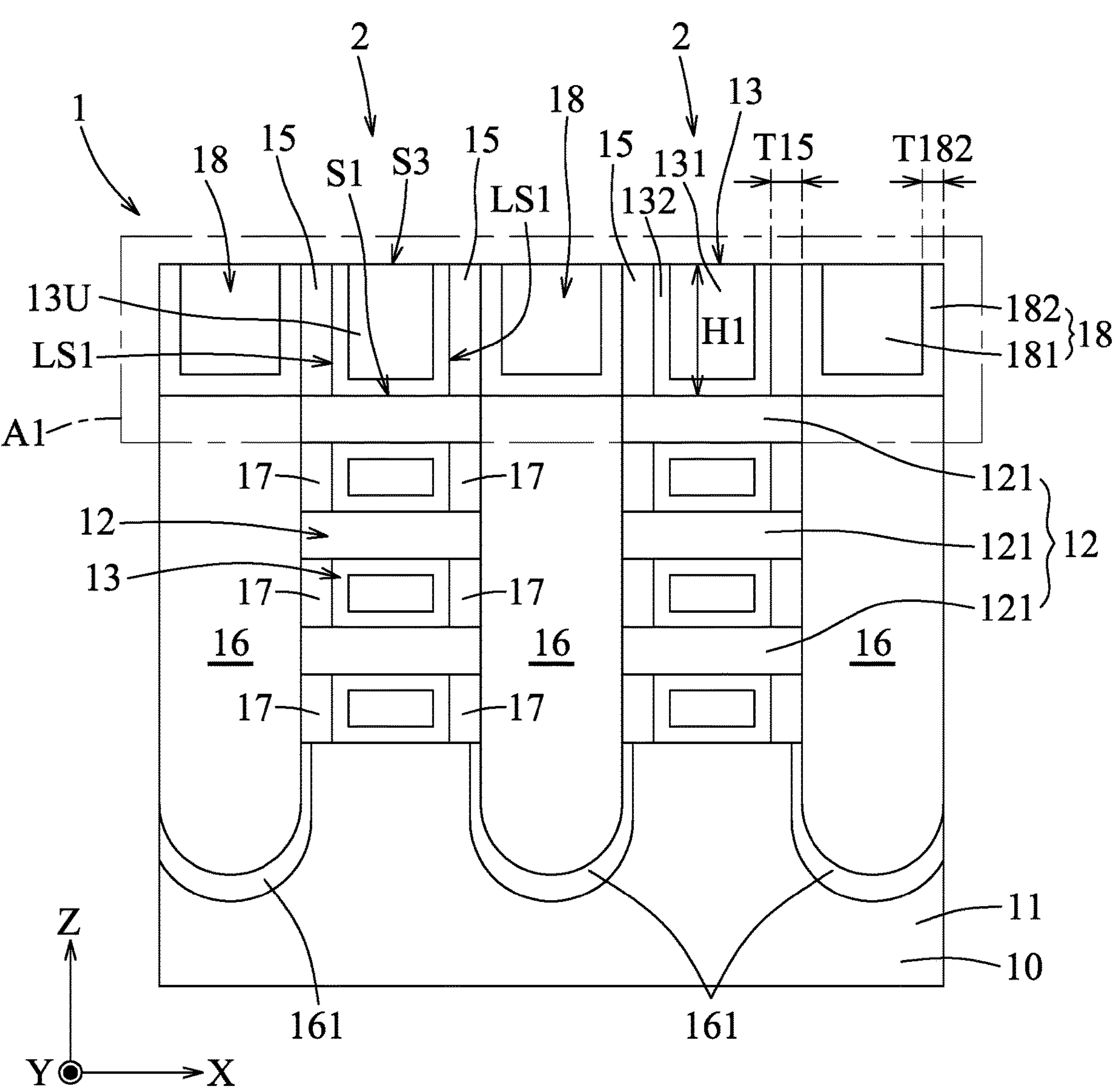
Figure 4:
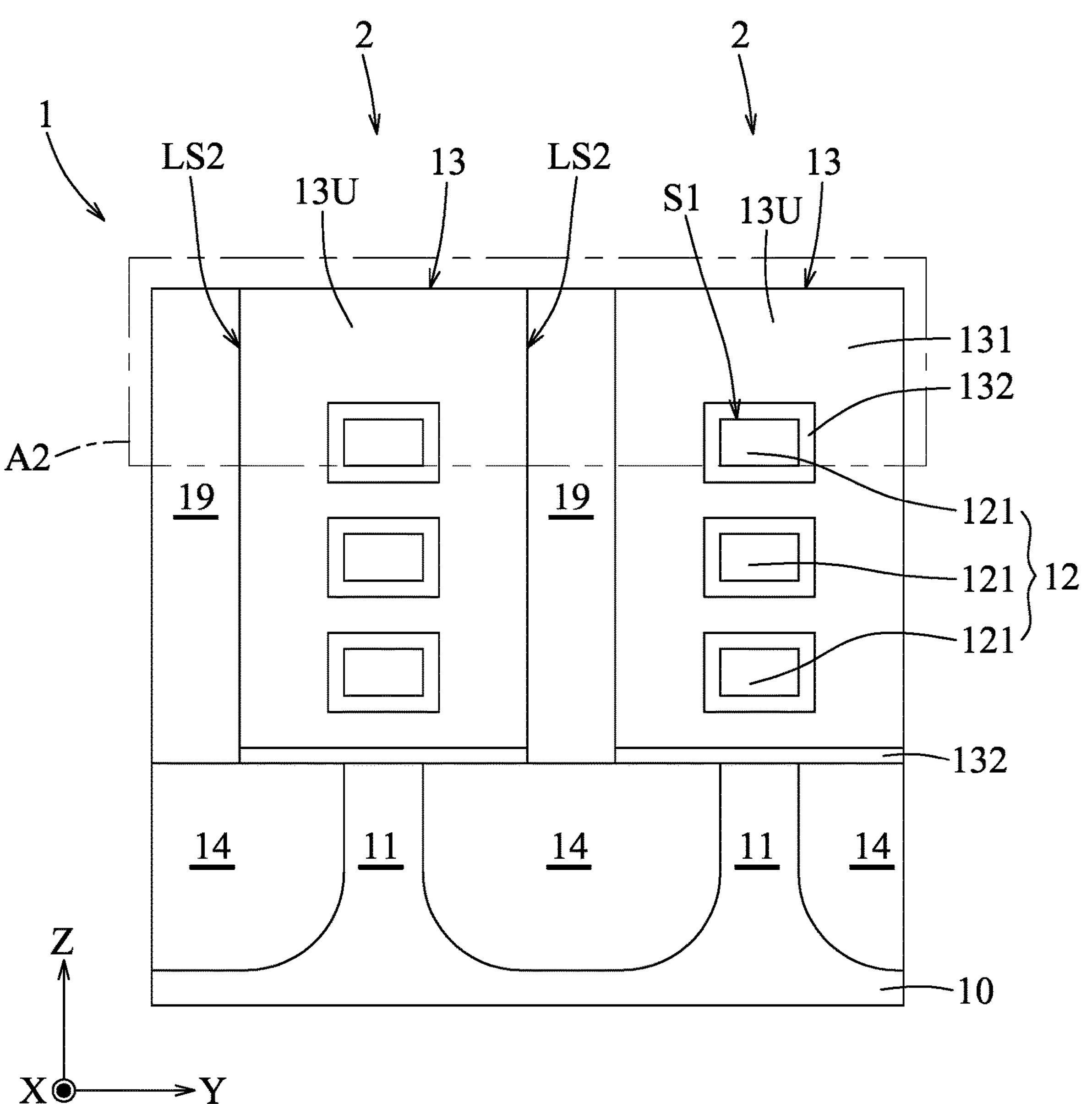

Referring to FIG. 1 and the examples illustrated in FIGS. 2, 3 and 4, the method 100 begins at step S101, where a patterned structure 1 is formed. FIG. 2 is a top schematic view of the patterned structure 1 in accordance with some embodiments, in which fins 11 and gate structures 13 are shown, and other elements are omitted. FIGS. 3 and 4 are cross-sectional views respectively taken along lines A-A' and B-B' of FIG. 2 in accordance with some embodiments, but further illustrating the other elements omitted in FIG. 2.

In some embodiments, as shown in FIGS. 3 and 4, the patterned structure 1 includes a substrate 10, a plurality of fins 11 (two of which are shown in FIGS. 2 and 4), a plurality of devices 2, a plurality of isolation regions 14, and a plurality of isolation sections 19.

In some embodiments, the substrate 10 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the substrate 10 may be doped with p-type impurities or n-type impurities, or undoped. In addition, the substrate 10 may be a bulk silicon substrate, a silicon-on-insulator (SOI) substrate, or a germanium-on-insulator (GOI) substrate. Other suitable materials for the substrate 10 are within the contemplated scope of the present disclosure.

As shown in FIG. 2, the fins 11 are each elongated in an X direction, and are spaced apart from each other in a Y direction transverse to the X direction. In some embodiments, each of the fins 11 may be made from a material the same as or different from that of the substrate 10. Since suitable materials for the fins 11 are similar to those for the substrate 10, the details thereof are omitted for the sake of brevity.

Each of the devices 2 includes a channel structure 12, a gate structure 13, a pair of gate sidewalls 15, a pair of source/drain features 16, a plurality of inner spacers 17, and a pair of the isolation portions 18.

In some embodiments, as shown in FIG. 3, the devices 2 displaced from one another in the X direction are formed on the same one of the fins 11. In some embodiments, as shown in FIG. 4, the devices 2 displaced from one another in the Y direction are respectively formed on the fins 11 which are isolated from each other through the isolation regions 14, and the gate structures 13 of the devices 2 are isolated from each other through the isolation sections 19. It should be noted that although step S101 of the method 100 is exemplified using the devices 2 having a gate-all-around structure, where each of the channel structures 12 including a plurality of channel features 121, in some other not shown embodiments, the devices may be configured as fin-type field-effect transistors (FinFET), complementary FETs (CFETs), forksheet FETs, but is not limited thereto. To be specific, the channel structure includes a single channel feature in each of the FinFETs, and the channel structure includes a plurality of the channel features in each of the CFETs and forksheet FETs. It should be also noted that the number of the devices 2 can be varied according to the circuit design of the semiconductor structure 3 (see FIGS. 25 and 29).

In some embodiments, as shown in FIG. 4, each of the isolation regions 14 may be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation regions 14 are within the contemplated scope of the present disclosure.

In some embodiments, the channel structure 12 includes three of the channel features 121 which are spaced apart from each other in a Z direction transverse to both the X and Y directions. In some embodiments, the X, Y and Z direction are perpendicular to one another. Each of the channel features 121 may be made from a material the same as or different from that of the substrate 10. Since suitable materials for the channel features 121 are similar to those for the substrate 10, the details thereof are omitted for the sake of brevity. The channel structure 12 has an uppermost surface S1 opposite to the substrate 10.

In some embodiments, the gate structure 13 is disposed on the channel features 121 of the channel structure 12, and includes a gate electrode 131 and a gate dielectric layer 132 disposed to separate the channel features 121 of the channel structure 12 from the gate electrode 131. In some embodiments, as shown in FIG. 2, the gate structure 13 is elongated in the Y direction, and the gate structures 13 of the devices 2 on the same one of the fins 11 are spaced apart from each other in the X direction. In some embodiments, the gate dielectric layer 132 includes silicon oxide, silicon nitride, silicon oxynitride, a high dielectric constant (high-k) material (such as hafnium oxide, zirconium oxide, zirconium aluminum oxide, hafnium aluminum oxide, hafnium silicon oxide, aluminum oxide, and so on), other suitable materials, or combinations thereof. Other suitable materials for the gate dielectric layer 132 are within the contemplated scope of the present disclosure. In some embodiments, the gate electrode 131 may be configured as a multi-layered structure including at least one work function metal which is provided for adjusting threshold voltage of an n-FET or a p-FET, an electrically conductive material having a low resistance which is provided for reducing electrical conductivity of the gate electrode 131, other suitable materials, or combinations thereof. In some embodiments, the work function metal of the gate electrode 131 for forming an n-FET may be different from that for forming a p-FET so as to permit the n-FET and the p-FET to have different threshold voltages. Other suitable methods for adjusting the threshold voltages are within the contemplated scope of the present disclosure. In some embodiments, the gate electrode 131 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the gate electrode 131 are within the contemplated scope of the present disclosure. The gate structure 13 includes an upper gate portion 13U which is located at a level higher than that of the uppermost surface S1 of the channel structure 12. The upper gate portion 13U has two first lateral sides LS1 (see FIG. 3) which are opposite to each other in the X direction, and two second lateral sides LS2 (see FIG. 4) which are opposite to each in the Y direction. The upper gate portion 13U has a predetermined height H1 which may be adjusted by controlling process parameters during formation of the gate structure 13. When the predetermined height H1 is too high, a parasitic capacitance between the upper gate portion 13U of one of the devices 2 and the upper gate portion 13U of an adjacent one of the devices 2 may be too large. When the predetermined height H1 is too low, the channel structure 12 disposed beneath the upper gate portion 13U of the gate structure 13 may be undesirably damaged during formation of a gate contact (not shown) on the upper gate portion 13U.

In some embodiments, the gate sidewalls 15 are respectively located at the two first lateral sides LS1 of the upper gate portion 13U, and each of the gate sidewalls 15 has an upper surface flush with an upper surface S3 of the upper gate portion 13U. In some embodiments, each of the gate sidewalls 15 can be one or multiple layers, and includes such as silicon oxide ($SiO_x$), silicon nitride ($SiN_x$), silicon oxynitride ($SiO_xN_y$), silicon carbonitride ($SiC_xN_y$), silicon oxycarbide ($SiO_xC_y$), silicon oxycarbonitride ($SiO_xC_yN_z$), silicon carbide ($SiC_x$), or combinations thereof, but is not limited thereto. In some embodiments, each of the gate sidewalls 15 may have a dielectric constant (k) ranging from about 3.9 to about 4.5. In some embodiments, each of the gate sidewalls 15 has a thickness T15 ranging from about 1 nm to about 5 nm.

In some embodiments, the source/drain features 16 are disposed at two sides of the channel structure 12, and spaced apart from each other in the X direction, such that each of the channel features 121 extends between the source/drain features 16. In some embodiments, the source/drain features 16 may be independently doped with an n-type impurity or a p-type impurity, and may be formed as a single layer structure or a multi-layered structure having several sub-layers with different doping concentration. In some embodiments, the source/drain features 16 may have a p-type conductivity, and includes single crystalline or polycrystalline silicon, single crystalline or polycrystalline silicon germanium, or other suitable materials doped with a p-type impurity so as to function as a source/drain of a p-FET. The p-type impurity may be, for example, but not limited to, boron (B), aluminum (Al), gallium (Ga), indium (In), other suitable materials, or combinations thereof. In some embodiments, the source/drain features 16 may have an n-type conductivity, and includes single crystalline silicon, polycrystalline silicon or other suitable materials doped with an n-type impurity so as to function as a source/drain of an n-FET. The n-type impurity may be, for example, but not limited to, nitrogen (N), phosphorous (P), arsenic (As), antimony (Sb), other suitable materials, or combinations thereof. It is noted that each of the source/drain features 16 may refer to a source or a drain, individually or collectively dependent upon the context. In some embodiments, the patterned structure 1 further includes a plurality of isolation layers 161, each of which is disposed beneath a corresponding one of the source/drain features 16 of the devices 2, such that the corresponding one of the source/drain features 16 is electrically isolated from the substrate 10 and a corresponding one of the fins 11, thereby preventing a leakage current from flowing from the corresponding one of the source/drain features 16 to an adjacent element through the substrate 10 and/or the corresponding fin 11.

In some embodiments, the gate structure 13 is spaced apart from the source/drain features 16 by the inner spacers 17. In some embodiments, each of the inner spacers 17 may include a suitable low-k material (such as silicon oxide, silicon nitride, silicon oxynitride, silicon carbonitride, silicon oxycarbide, silicon oxycarbonitride, silicon carbide, and so on). Other suitable materials for the inner spacers 17 are within the contemplated scope of the present disclosure.

In some embodiments, the isolation portions 18 are respectively disposed on the source/drain features 16. Each of the isolation portions 18 includes an inter-layer dielectric (ILD) feature 181 and a contact etching stop feature 182 which is disposed between the ILD feature 181 and a corresponding one of the source/drain features 16, and which is disposed to separate the ILD feature 181 from the gate sidewalls 15 of two adjacent ones of the devices 2. In some embodiments, the ILD feature 181 may include a suitable low-k material (such as the examples described in the preceding paragraph). In some embodiments, the contact etching stop feature 182 may be made of a material different from that of the ILD feature 181 so as to serve as an etching stop layer during an etching process to be subsequently performed. Possible materials suitable for forming the contact etching stop feature 182 may include suitable low-k materials or high-k materials (such as the examples described in the preceding paragraph). Other suitable materials for the ILD feature 181 and the contact etching stop feature 182 are within the contemplated scope of the present disclosure. In some embodiments, the etching stop contact feature 182 of each of the isolation portions 18 has a thickness T182 ranging from about 2 nm to about 5 nm.

In some embodiments, each of the isolation sections 19 (two of which are shown in FIG. 4) is located on a corresponding one of the isolation regions 14. The isolation sections 19 are elongated in the X direction and spaced apart from each other in the Y direction, such that the gate structures 13 of the two adjacent devices 2 are spaced apart from each other in the Y direction by a corresponding one of the isolation sections 19. In some embodiments, each of the isolation sections 19 may include a suitable low-k material and/or a high-k material (such as the examples described in the preceding paragraph). Other suitable materials for the isolation sections 19 are within the contemplated scope of the present disclosure.

In some embodiments, the patterned structure 1 may by formed by sub-steps of: (i) patterning a semiconductor substrate and a stack (not shown) formed thereon to form a plurality of fin structures disposed on the substrate 10, each of the fin structures including one of the fins 11 and a corresponding one of stack portions (not shown) disposed on the fin 11 (the semiconductor substrate is patterned into the substrate 10 and the fins 11, and the stack is patterned into the stack portions, each of which including a plurality of sacrificial films and a plurality of channel films disposed to alternate with the sacrificial films in the Z direction), (ii) forming the isolation regions 14 such that each of the isolation regions 14 is disposed between two adjacent ones of the fins 11 in the Y direction and that the stack portions are exposed from the isolation regions 14, (iii) forming a plurality of dummy gate portions (not shown) over the fin structures such that each of the fin structures has a plurality pairs of portions, each pair of which are exposed from a corresponding one of the dummy gate portions and respectively located at two opposite sides of the corresponding dummy gate portion in the X direction, (iv) forming a plurality pairs of dummy gate spacers (not shown), each pair of which are respectively formed at two opposite sides of a corresponding one of the dummy gate portions in the X direction, (v) etching the plurality pairs of the exposed portions of the fin structures to form a plurality pairs of source/drain recesses (not shown), respectively, such that the channel films are respectively patterned into the channel features 121 and the sacrificial films are respectively patterned into sacrificial features (not shown), (vi) recessing the sacrificial features through the source/drain recesses to form lateral recesses (not shown), (vii) forming the inner spacers 17 respectively in the lateral recesses to cover the remaining sacrificial features, (viii) forming a plurality pairs of the source/drain features 16 respectively in the plurality pairs of the source/drain recesses, such that each of the channel features 121 extends between a corresponding pair of the source/drain features 16. (ix) forming a plurality pairs of the isolation portions 18 respectively on the plurality pairs of the source/drain features 16, (x) removing the dummy gate portions and the remaining sacrificial features using a wet etching process or other suitable processes to form a plurality of cavities (not shown), and (xi) sequentially depositing materials for forming the gate electrode 131 and the gate dielectric layer 132 to fill the cavities by a blanket deposition process, such as chemical vapor deposition (CVD), atomic layer deposition (ALD), molecular-beam deposition (MBD), molecular layer deposition (MLD), or other suitable deposition techniques, (xii) performing a planarization process, for example, but not limited to, chemical mechanical polishing (CMP), to remove excesses of the materials for forming the gate electrode 131 and the gate dielectric layer 132 and to expose the isolation portions 18 such that a plurality of gate assemblies (not shown) which are each elongated in the Y direction and which are spaced apart from each other in the X direction are obtained, and (xiii) forming the isolation sections 19 to divide each of the gate assemblies into a plurality of the gate structures 13 and to divide the dummy gate spacers into a plurality pairs of the gate sidewalls 15. Thereafter, the plurality of the devices 2 are obtained. Other suitable processes for forming the patterned structure 1 are within the contemplated scope of the present disclosure.

For purposes of simplicity and clarity, in following steps, an upper portion of the patterned structure 1 (i.e., regions A1 and A2 respectively shown in FIGS. 3 and 4) and element(s) formed thereon are to be further illustrated in FIGS. 5 to 24 and 26 to 28, while other elements are omitted.

Figures 5, 6:
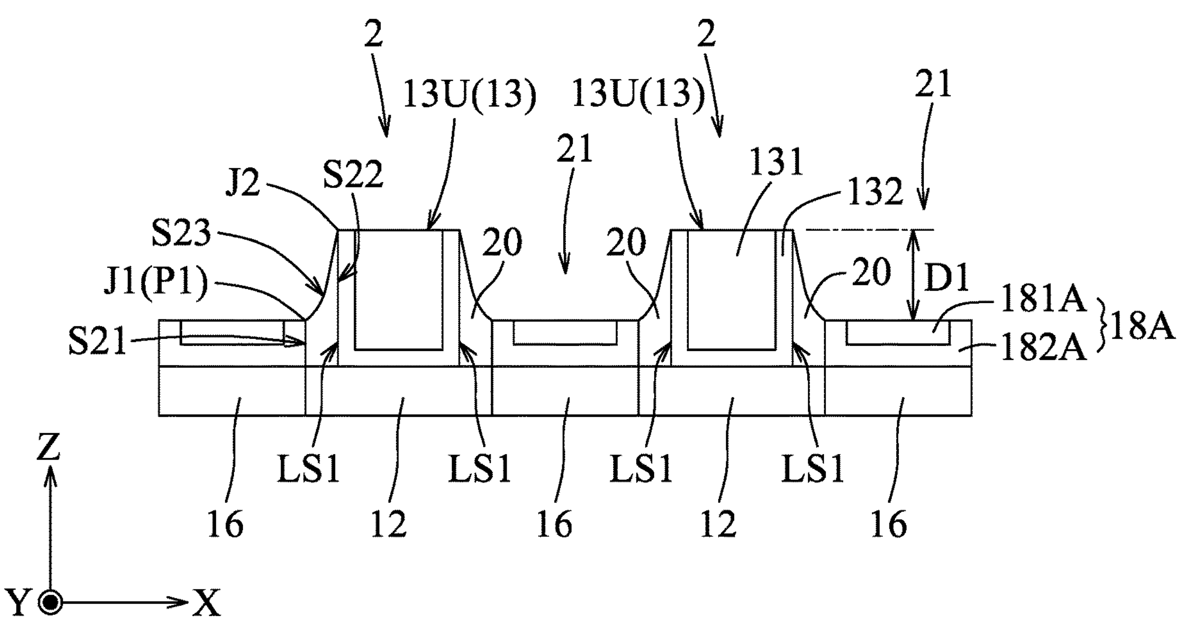

Referring to FIG. 1 and the examples illustrated in FIGS. 5 and 6, the method 100 proceeds to step S102, where the gate sidewalls 15 in each device 2 shown in FIG. 3 are formed into gate spacers 20, respectively. FIGS. 5 and 6 are views respectively similar to those of region A1 of FIG. 3 and region A2 of FIG. 4, but illustrating the structure after step S102.

In some embodiments, as shown in FIG. 5, the gate spacers 20 are respectively located at the first lateral sides LS1 of the upper gate portion 13U and opposite to each other in the X direction. In some embodiments, each of the gate spacers 20 has a first lateral surface S21 facing away the upper gate portion 13U in the X direction, a second lateral surface S22 opposite to the first lateral surface S21 and confronting the upper gate portion 13U, and an upward surface S23 disposed between the first and second lateral surfaces S21, S22. The upward surface S23 has a concave profile and faces away the substrate 10 (see FIG. 3). In some embodiments, the upward surface S23 has a first juncture J1 with the first lateral surface S21 and a second juncture J2 with the second lateral surface S22. The first juncture J1 is more proximate to the substrate 10 than the second juncture J2.

In some embodiments, the gate spacers 20 may be formed by recessing the gate sidewalls 15 using, for example, but not limited to, dry etching, wet etching, other suitable processes, or combinations thereof. Since a portion of the dielectric material of the gate sidewalls 15 may remain on the gate dielectric layer 132 of the upper gate portion 13U during recessing of the gate sidewalls 15, it can be observed that a lowest point P1 on the upward surface S23 of each of the gate spacers 20 is a furthest point away from the upper gate portion 13U. In some embodiments, the lowest point P1, which is also on the first juncture J1 may be at a level lower than a half of a height of the upper gate portion 13U.

It is noted that an etchant (for example, etching gas(es) used in a dry etching process and/or wet etchant(s) used in a wet etching process) has a relatively high etching selectivity to the gate sidewalls 15 shown in FIG. 3 relative to the gate structure 13. Hence, the upper gate portion 13U of the gate structure 13 is substantially not removed. In some embodiments, before recessing of the gate sidewalls 15, an electrically conductive material (not shown) may be selectively formed on the gate electrode 131 of the gate structure 13 by CVD, ALD, or other suitable deposition techniques, so as to prevent the gate electrode 131 from being damaged during recessing of the gate sidewalls 15. In some embodiments, the electrically conductive material may include W. TiN, or a combination thereof, but is not limited thereto. Other suitable electrically conductive materials suitable for protecting the gate electrode 131 are within the contemplated scope of the present disclosure.

During recessing of the gate sidewalls 15, the isolation portions 18 shown in FIG. 3 and the isolation sections 19 shown in FIG. 4 may be also recessed. After step S102, first grooves 21 are formed by recessing the isolation portions 18, and second grooves 22 are formed by recessing the isolation sections 19. As shown in FIG. 5, for each of the devices 2, a pair of the first grooves 21 are respectively formed at the first lateral sides LS1 of the upper gate portion 13U, and each of the first grooves 21 may have a depth D1 in the Z direction which ranges from about 2 nm to about 10 nm. As shown in FIG. 6, for each of the devices 2, a pair of the second grooves 22 are respectively formed at the second lateral sides LS2 of the upper gate portion 13U. In some embodiments, each of the second grooves 22 may have a depth D2 in the Z direction which is greater than the depth D1 of each of the first grooves 21. In some embodiments, the depth D2 may range from about 15 nm to about 30 nm.

After step S102, the remaining isolation portions, the remaining ILD features, the remaining contact etching stop features, and the remaining isolation sections are respectively denoted by numeral 18A, 181A, 182A, 19A. In some not shown embodiments, the remaining ILD features 181A may be removed after step S102.

Figure 7:
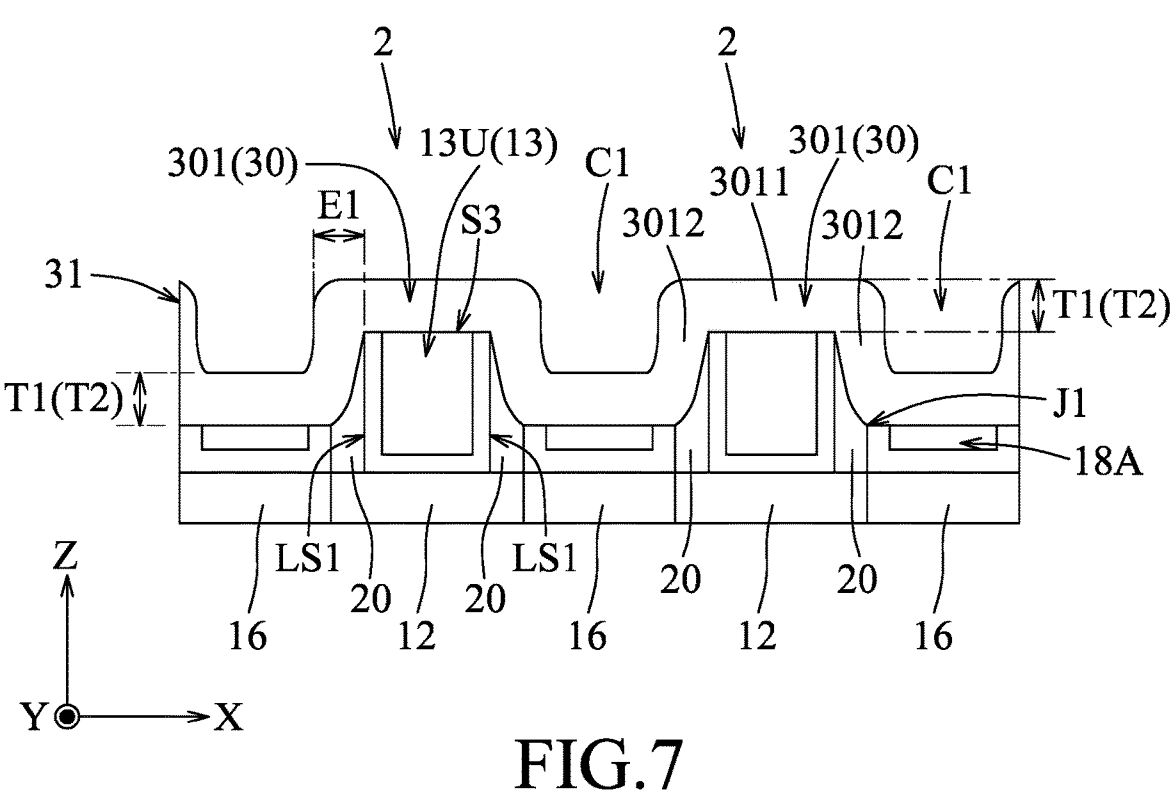
Figure 8:
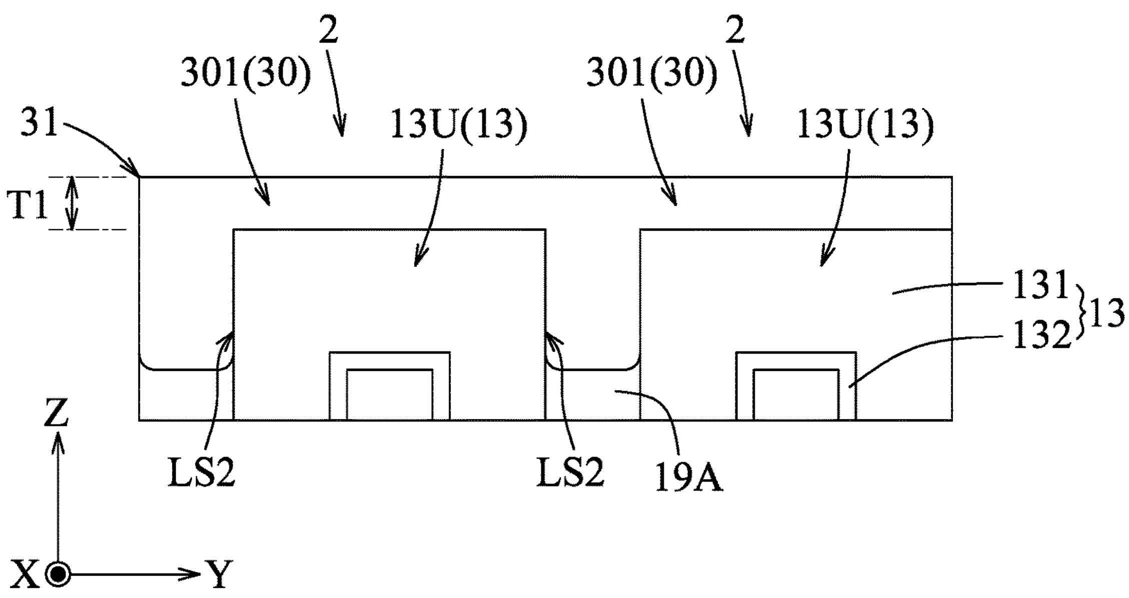
Figure 15:
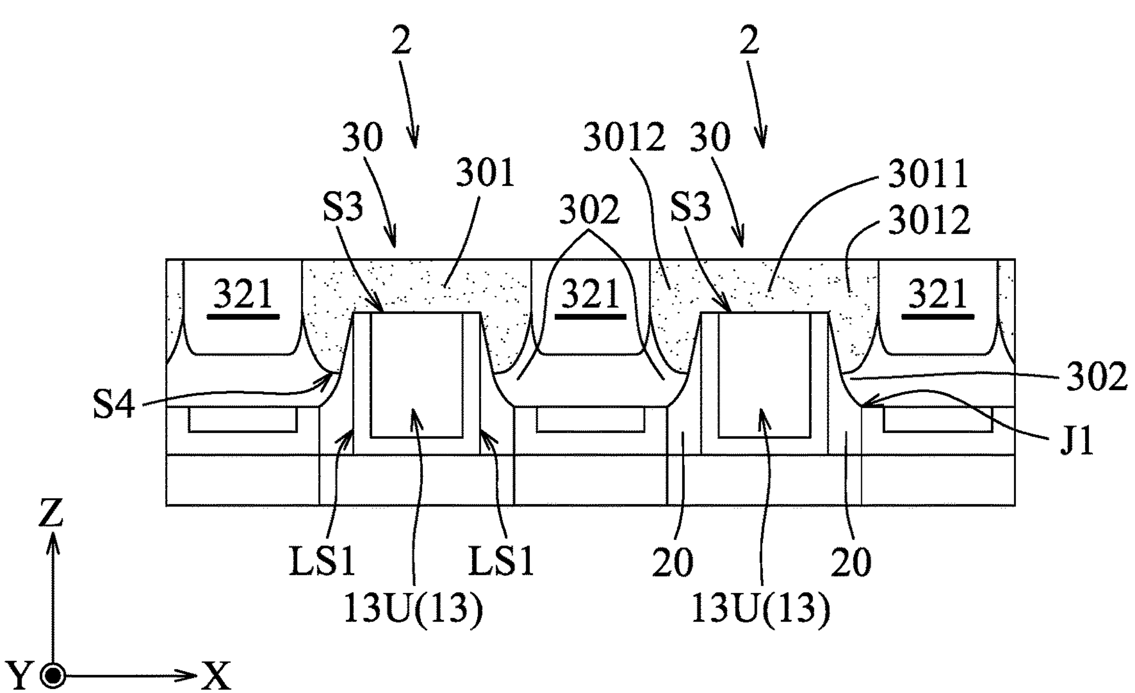
Figure 16:
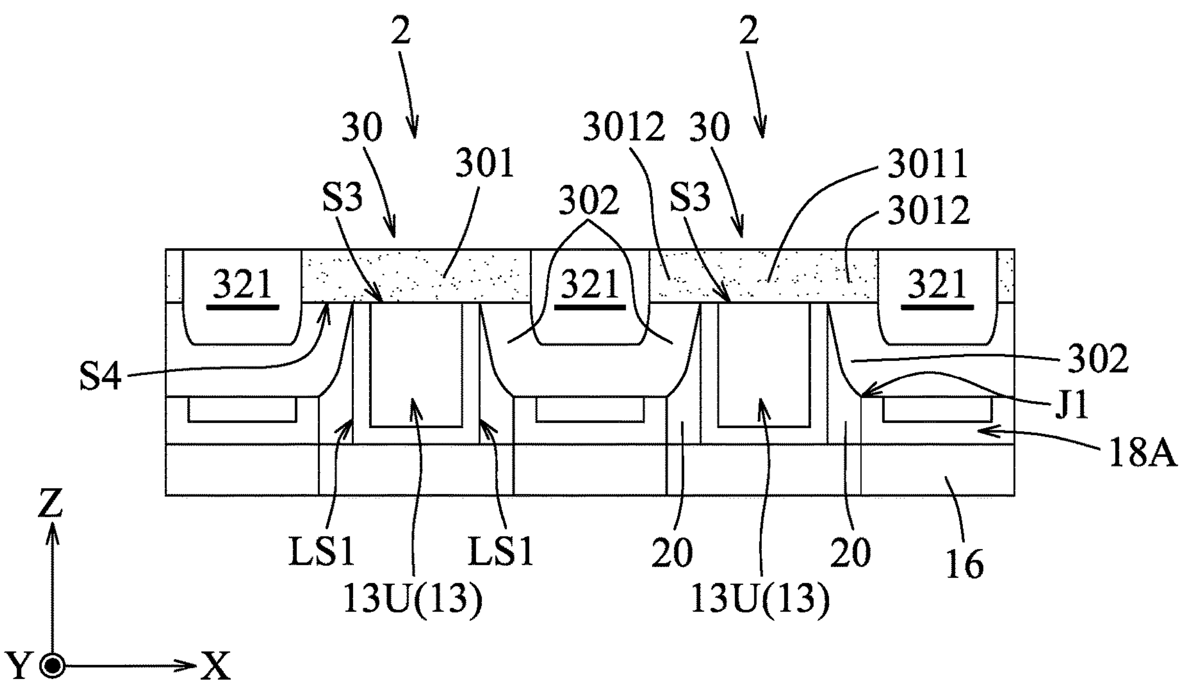
Figure 17:
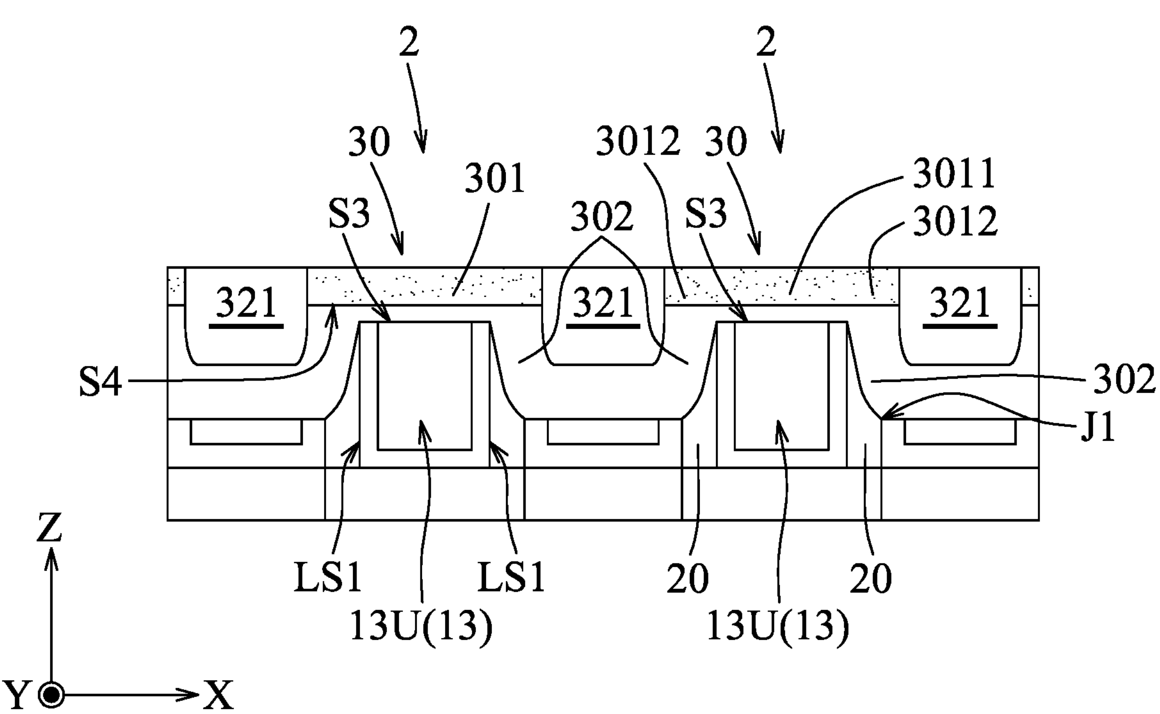
Figure 18:
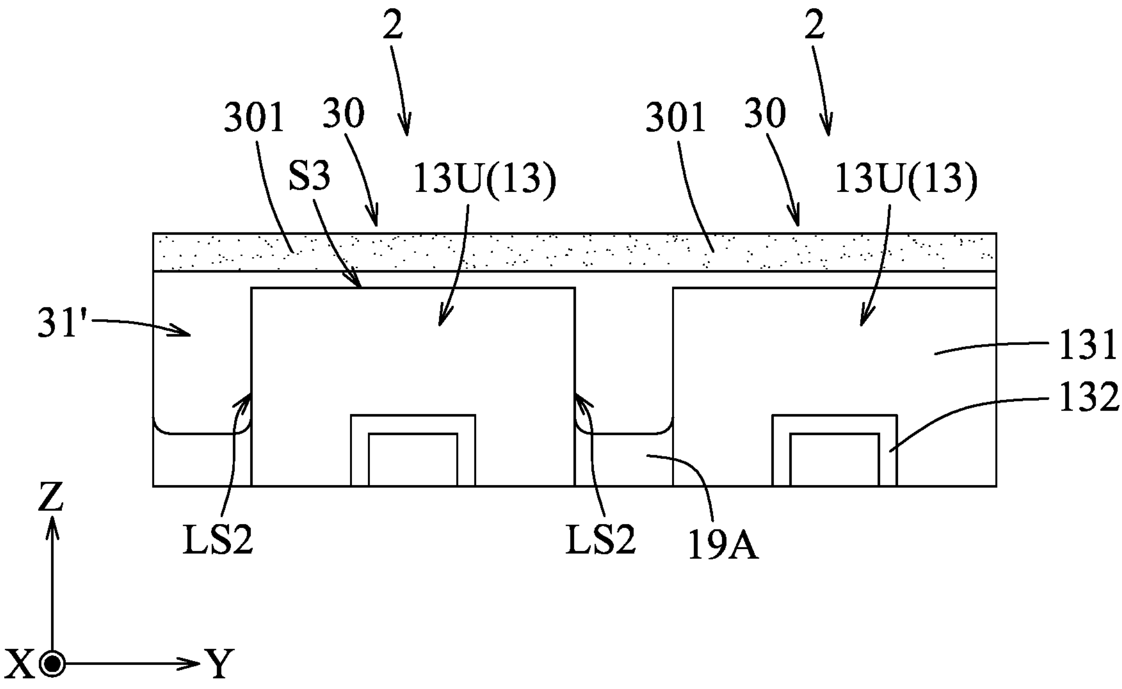
Figure 19:
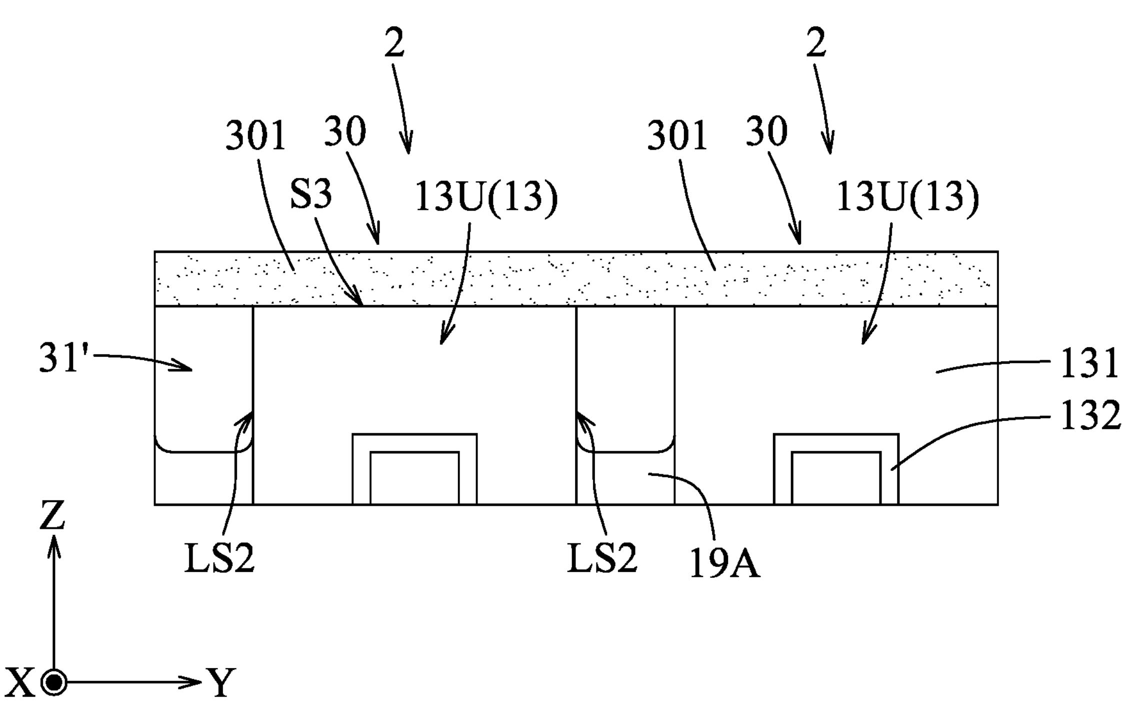
Figure 20:
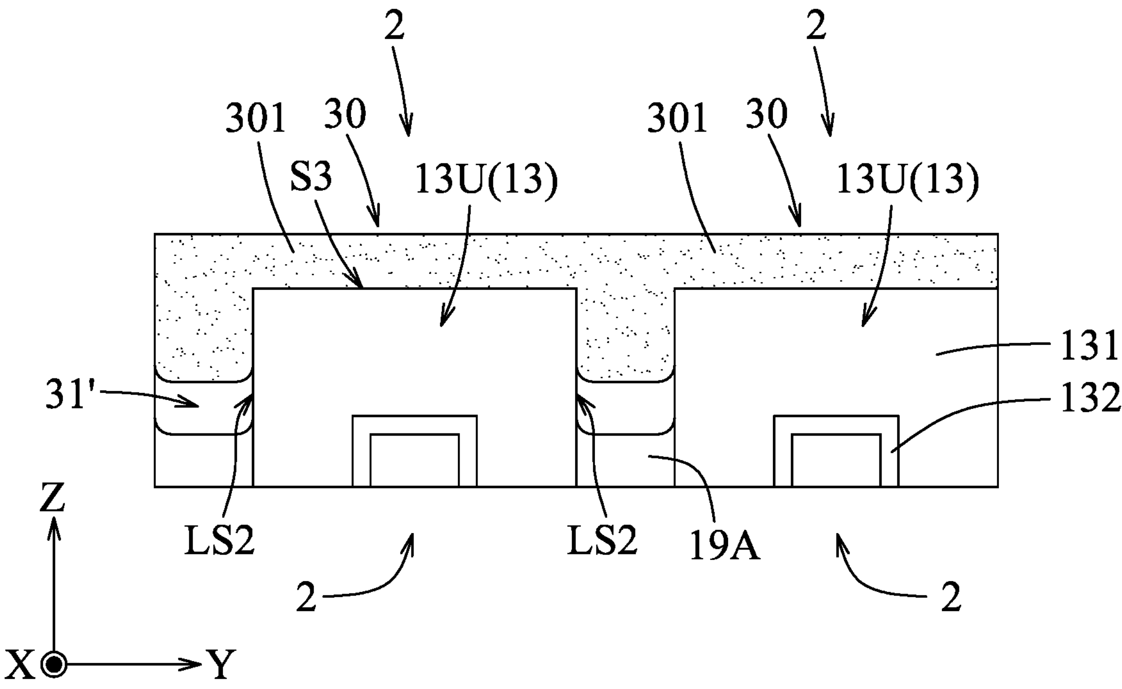

Referring to FIG. 1 and the examples illustrated in FIGS. 7 and 8, the method 100 proceeds to step S103, where each of the devices 2 is further formed with an insulating feature 30. FIGS. 7 and 8 are views similar to those of FIGS. 5 and 6, respectively, but illustrating the structures after step S103. FIGS. 15 to 17 are sectional views (X-cuts) similar to that of FIG. 7, but illustrating variants of the insulating feature 30 in accordance with some other embodiments. FIGS. 18 to 20 are sectional views (Y-cuts) similar to that of FIG. 8, but illustrating variants of the insulating feature 30 in accordance with some other embodiments.

The insulating feature 30 is disposed over the upper gate portion 13U and against the concave profiles of the gate spacers 20, and thus has an inverted U-shaped profile. In addition, the insulating feature 30 has a cap portion 301 which is made of a dielectric material different from that of each of the gate spacers 20. Chemical elements included in the dielectric material of the cap portion 301 may be different or the same as to those included in the dielectric material of the gate spacers 20. When the chemical elements included in the dielectric material of the cap portion 301 are the same as to those included in the dielectric material of the gate spacers 20, the chemical elements included in the dielectric material of the cap portion 301 are in different concentrations from those in the dielectric material of the gate spacers 20, and thus, the dielectric material of the cap portion 301 is different from that of each of the gate spacers 20. In some embodiments, the dielectric material of the cap portion 301 has a dielectric constant (k) greater than that of each of the gate spacers 20. The cap portion 301 is formed on the upper surface S3 of the upper gate portion 13U, and extends beyond an edge of the upper surface S3 of the upper gate portion 13U.

In some embodiments, as shown in FIGS. 7, 15, 16 and 17, in each of the devices 2, the cap portion 301 extends beyond the first lateral sides LS1 of the upper gate portion 13U. In some embodiments, the cap portion 301 includes a main region 3011 which covers the upper surface S3 of the upper gate portion 13U, two end regions 3012 which extend oppositely from the main region 3011 in the X direction. In some embodiments, as shown in FIGS. 8, 18, 19, and 20, the cap portion 301 of the insulating feature 30 further extends beyond the second lateral sides LS2 of the upper gate portion 13U.

In some embodiments, as shown in FIG. 7, in each of the devices 2, the cap portion 301 may have a dielectric constant (k) ranging from about 4.5 to 7. The end regions 3012 respectively extend toward the gate spacers 20, and are respectively disposed at the first lateral sides LS1 of the upper gate portion 13U. Furthermore, each of the end regions 3012 extends to cover the first juncture J1 of a corresponding one of the gate spacers 20. In some embodiments, the insulating features 30 of the devices 2 shown in FIGS. 7 and 8 may be formed by depositing a dielectric material layer for forming the cap portions 301 of the insulating features 30 on the structure obtained after step S102 (for example, but not limited to, the structures shown in FIGS. 5 and 6) by ALD, CVD or suitable deposition techniques, thereby the dielectric material layer serving as the insulating features 30 of the devices 2. In some embodiments, the dielectric material layer may be made of a dielectric material having a dielectric constant (k) ranging from about 4.5 to 7, such as silicon oxide, silicon nitride, silicon oxynitride, silicon carbonitride, silicon oxycarbide, silicon oxycarbonitride, silicon carbide, or combinations thereof, but is not limited thereto. Other suitable materials for the dielectric material layer are within the contemplated scope of the present disclosure. In some embodiments, the dielectric material layer may have a thickness T1 ranging from about 1 nm to about 10 nm. Therefore, the thickness of the cap portion 301 also ranges from about 1 nm to about 10 nm, and the cap portion 301 extends beyond the edge of the upper surface S3 of the upper gate portion 13U by a distance E1 ranging from about 1 nm to about 10 nm.

In some embodiments, a first variant of the insulating feature 30 is shown in FIG. 15. In each of the devices 2, the insulating feature 30 of the first variant has a structure similar to that of the insulating feature 30 shown in FIG. 7, but has the differences as described in the following. For the insulating feature 30 of the first variant, each of the end regions 3012 is spaced apart from the first juncture J1 of a corresponding one of the gate spacers 20. The cap portion 301 has a bottommost surface S4 which is at a level lower than that of the upper surface S3 of the upper gate portion 13U. In some embodiments, the cap portion 301 may have a dielectric constant (k) ranging from about 6 to about 25, in some cases, from about 7 to about 25, in some cases, from about 8 to about 25, in some cases, from about 9 to about 25. In some embodiments, the cap portion 301, which has a relatively high dielectric constant (k) relative to the cap portion 301 shown FIG. 7, provides a sufficient protection for the upper gate portion 13U during an etching process to be subsequently performed. In some embodiments, the insulating feature 30 further includes two wall portions 302, each of which extends from one of the end regions 3012 to cover a corresponding one of the gate spacers 20. Each of the wall portions 302 is made of a dielectric material different from that of the cap portion 301 and has a dielectric constant (k) less than that of the cap portion 301. In some embodiments, the dielectric constant (k) of each of the wall portions 302 may range from about 3.9 to about 7.

In some embodiments, a second variant of the insulating feature 30 is shown in FIG. 16. In each of the devices 2, the insulating feature 30 of the second variant has a structure similar to that of the insulating feature 30 shown in FIG. 15, but the bottommost surface S4 of the cap portion 301 is at a level substantially equal to that of the upper surface S3 of the upper gate portion 13U. In this case, the cap portion 301 with a relatively smaller dimension in the Z direction may provide a sufficient protection for the upper gate portion 13U during an etching process to be subsequently performed, and reduces a parasitic capacitance generated in each of the devices 2.

In some embodiments, a third variant of the insulating feature 30 is shown in FIG. 17. In each of the devices 2, the insulating feature 30 of the third variant has a structure similar to that of the insulating feature 30 shown in FIG. 16, but the bottommost surface S4 of the cap portion 301 is at a level higher than that of the upper surface S3 of the upper gate portion 13U.

In some other embodiments, formation of variants of the insulating feature 30 shown in FIGS. 15 to 17 may include sub-steps SS1 to SS6.

In sub-step SS1, as shown in FIGS. 7 and 8, a first dielectric layer 31 is formed on the structure obtained after step S102 (for example, but not limited to, the structures shown in FIGS. 5 and 6) by CVD, ALD, or other suitable deposition techniques, such that the first dielectric layer 31 is formed over the upper gate portion 13U, the gate spacers 20 and the remaining isolation portions 18A of the devices 2, and the remaining isolation sections 19A. In some embodiments, the first dielectric layer 31 may be made of silicon oxide, silicon nitride, silicon oxynitride, silicon carbonitride, silicon oxycarbide, silicon oxycarbonitride, silicon carbide, or other suitable dielectric materials, and has a dielectric constant (k) ranging from about 3.9 to about 7. In some embodiments, the first dielectric layer 31 may have a thickness T2 ranging from about 1 nm to about 10 nm. In some embodiments, the first dielectric layer 31 may have a plurality of inverted U-shaped portions which are in positions respectively above the upper gate portions 13U of the devices 2 due to the surface undulation of the structure obtained after step S102. In some embodiments, the configuration (e.g., shape and thickness) of the first dielectric layer 31 will affect the configuration of the cap portion 301 of the insulating feature 30 in each of the devices 2 to be formed subsequently. Although in some embodiments, the first electric layer 31 obtained in sub-step SS1 can serve as the insulating feature 30, in some other embodiments, other sub-steps are further performed for obtaining the variants of the insulating feature 30.

Figure 9:
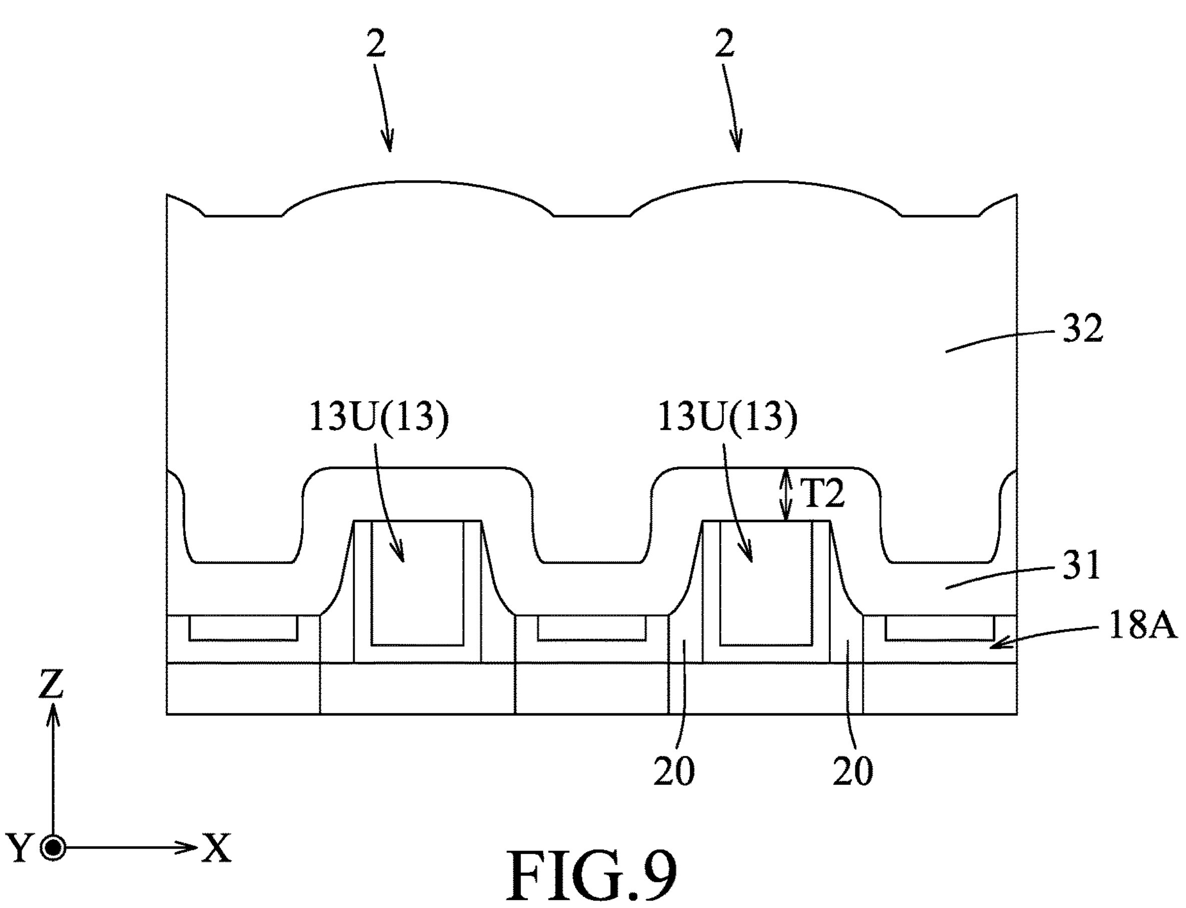

In sub-step SS2, as shown in FIG. 9, a second dielectric layer 32 is formed on the first dielectric layer 31 by CVD, ALD, or other suitable deposition techniques. The second dielectric layer 32 has a thickness much greater than the thickness T2 of the first dielectric layer 31, such that the second dielectric layer 32 fills a plurality of caves C1 (see FIG. 7) each formed between two adjacent ones of the inverted U-shaped portions. Possible materials suitable for forming the second dielectric layer 32 are similar to those for forming the first dielectric layer 31, and thus details thereof are omitted for the sake of brevity. It is noted that when the second dielectric layer 32 is made of a material different from that of the first dielectric layer 31, the first dielectric layer 31 may serve as a stop layer during a planarization process and/or an etching process to be subsequently performed.

Figure 10:
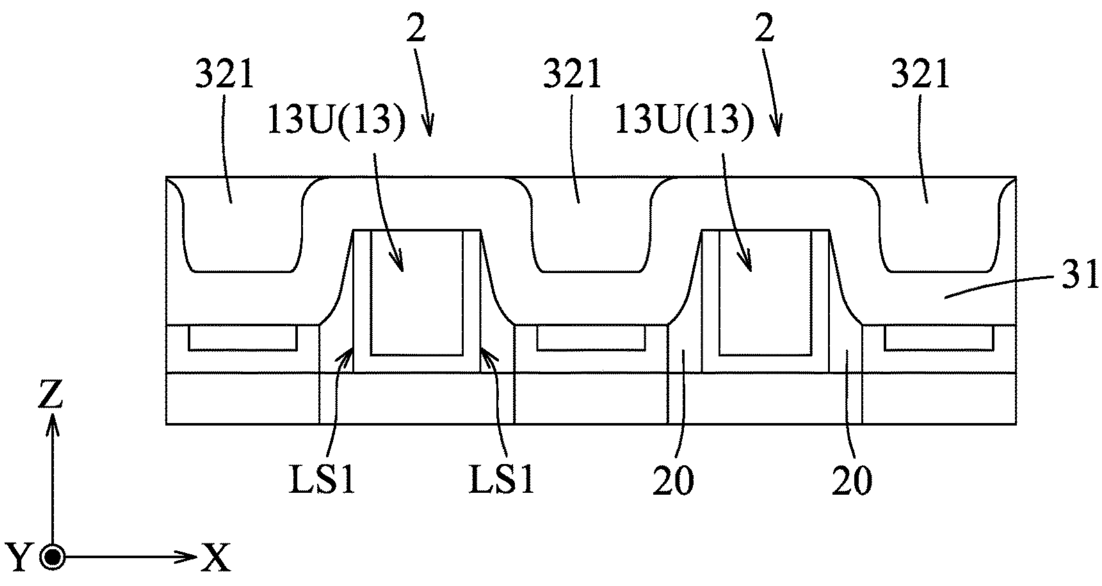

In sub-step SS3, as shown in FIGS. 8 and 10, the second dielectric layer 32 is planarized to expose the first dielectric layer 31 such that for each of the devices 2, the planarized second dielectric layer 32 has a pair of second dielectric regions 321 which are respectively disposed at the first lateral sides LS1 of the upper gate portion 13U. It is noted that the thickness of the first dielectric layer 31 may affect a dimension of each of the second dielectric regions 321. The structure shown in FIG. 8 is substantially not changed after sub-step SS3.

Figure 11:
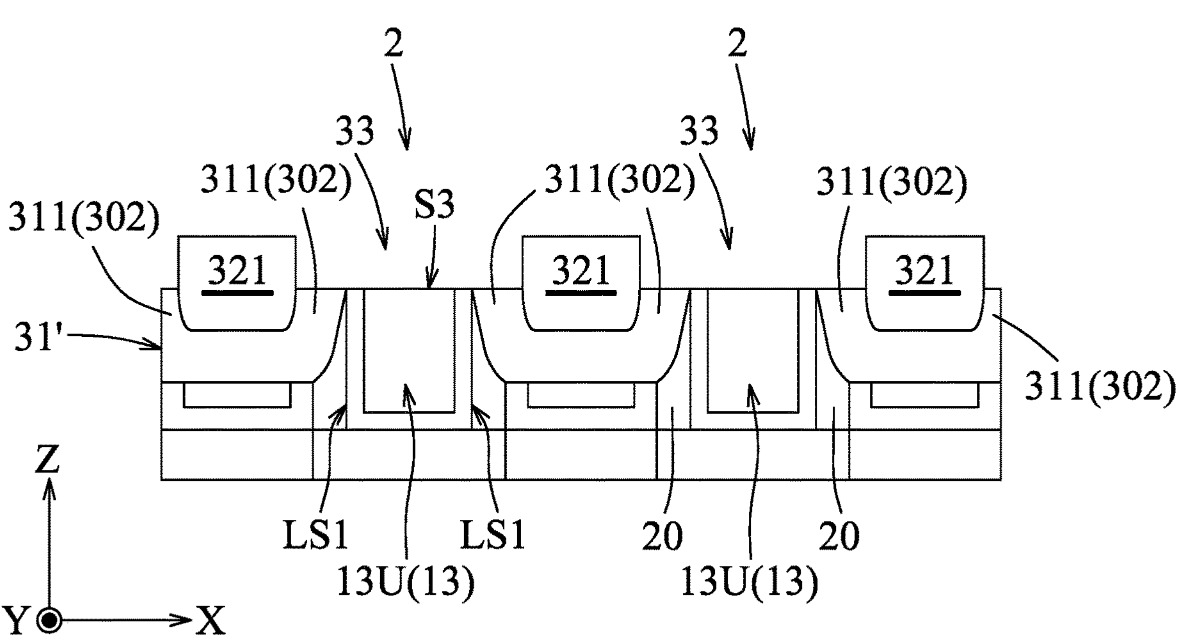
Figure 12:
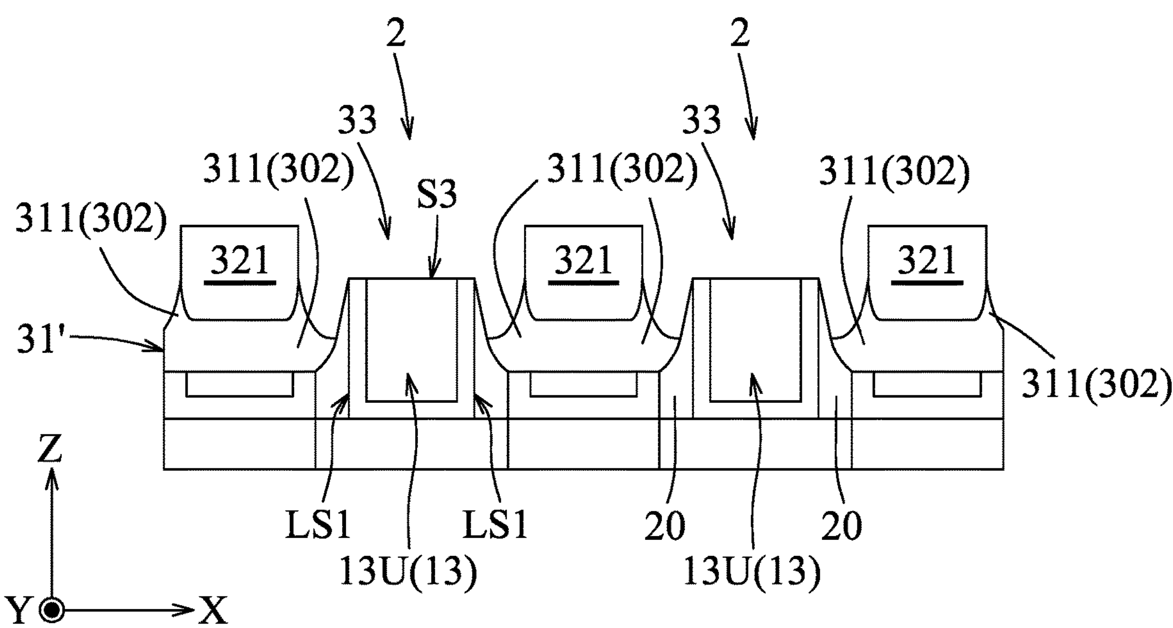
Figure 13:
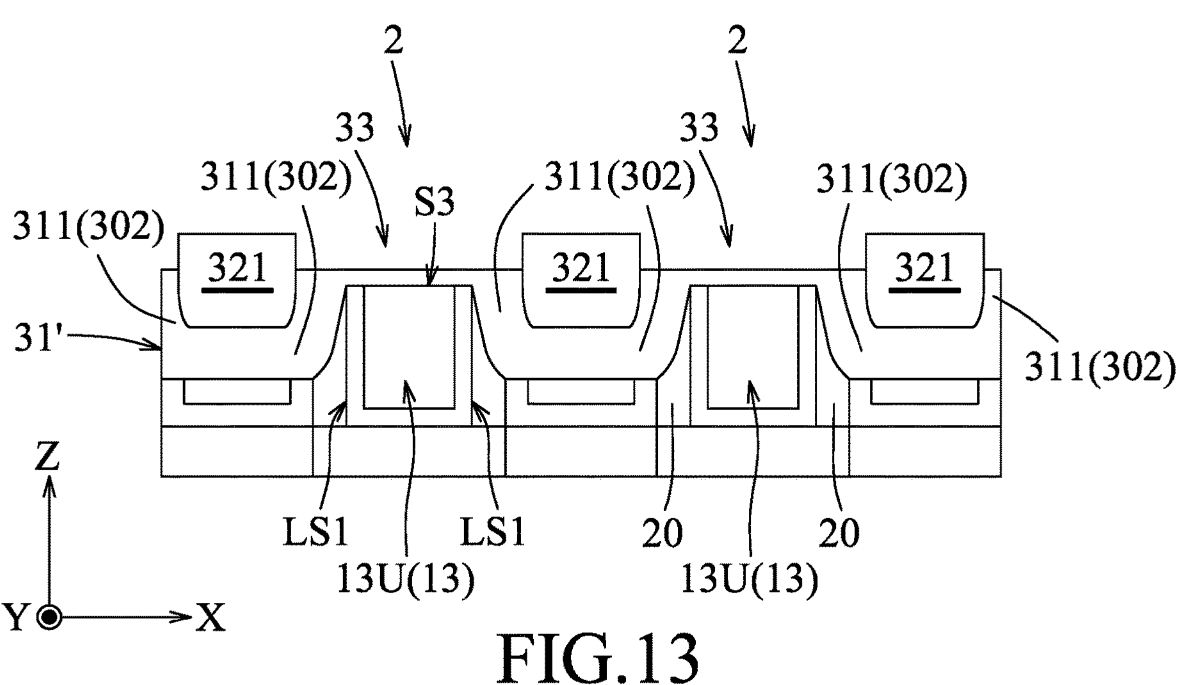

In sub-step SS4, as shown in FIGS. 11 to 13, the first dielectric layer 31 (see FIG. 10) is etched back to form a third groove 33 for each of the devices 2 by, for example, but not limited to, dry etching, wet etching, other suitable etching techniques, or combinations thereof, such that for each of the devices 2, the etched first dielectric layer which is denoted by 31' has a pair of first dielectric regions 311 which are respectively formed at the first lateral sides LS1 of the upper gate portion 13U, and which respectively serve as the two wall portions 302 of the insulating feature 30. The first dielectric regions 311 are recessed relative to the second dielectric regions 321. It is noted that since an etchant (for example, etching gas(es) used in a dry etching process and/or etchant(s) used in a wet etching process) used in sub-step SS4 has a relatively high etching selectivity to the first dielectric layer 31 relative to the second dielectric regions 321 and the gate structures 13 of the devices 2, the second dielectric regions 321 and the gate structures 13 are substantially not removed. Furthermore, the third groove 33 has a bottom surface that may have different configurations (e.g., contours) according to the etching technique used in sub-step SS4. For example, the bottom surface contour of the third groove 33 undergoing a dry etching process may be different from the bottom surface contour of the third groove 33 undergoing a wet etching process. In some embodiments, during etching back of the first dielectric layer 31, the first dielectric layer 31 shown in FIG. 8 may be also etched back to form a plurality of trenches (not shown).

In some embodiments, the etching back process in sub-step SS4 may be a time-controlled etching process where the etching is stopped after a period of time so as to control depths of the third grooves 33 (see FIGS. 11 to 13) and the trenches in a cross-sectional view along the Y direction. FIGS. 11 to 13 are schematic cross-sectional views respectively illustrating the third grooves 33 with different depths along the X direction in accordance with some embodiments.

In some embodiments, for forming the second variant of the insulating feature 30 (see FIG. 16), the structure shown in FIG. 10 is subjected to the etching back process for a first predetermined time period so as to permit the upper surface S3 of the upper gate portion 13U in each of the devices 2 to be exposed after etching back the first dielectric layer 31, thereby obtaining the structure shown in FIG. 11. In this case, for each of the devices 2, each of the wall portions 302 has an upper surface flush with the upper surface S3 of the upper gate portion 13U, and the wall portions 302, which are respectively disposed at the first lateral sides LS1 of the upper gate portion 13U, are spaced apart from each other.

In some embodiments, for forming the first variant of the insulating feature 30 (see FIG. 15), the structure shown in FIG. 10 is subjected to the etching back process for a second predetermined time period longer than the first predetermined time period, thereby obtaining the structure shown in FIG. 12. The structure shown in FIG. 12 is similar to that of FIG. 11 but for each of the devices 2, each of the wall portions 302 has an upper surface which is recessed relative to the upper surface S3 of the upper gate portion 13U.

In some embodiments, for forming the third variant of the insulating feature 30 (see FIG. 17), the structure shown in FIG. 10 is subjected to the etching back process for a third predetermined time period shorter than the first predetermined time period such that, for each of the devices 2, the upper surface S3 of the upper gate portion 13U may not exposed after etching back the first dielectric layer 31, thereby obtaining the structure shown in FIG. 13. In this case, for each of the devices 2, the wall portions 302, which are respectively disposed at the first lateral sides LS1 of the upper gate portion 13U, may be connected to each other, and each of the wall portions 302 has an upper surface at a level higher than that of the upper surface S3 of the upper gate portion 13U.

Figure 14:
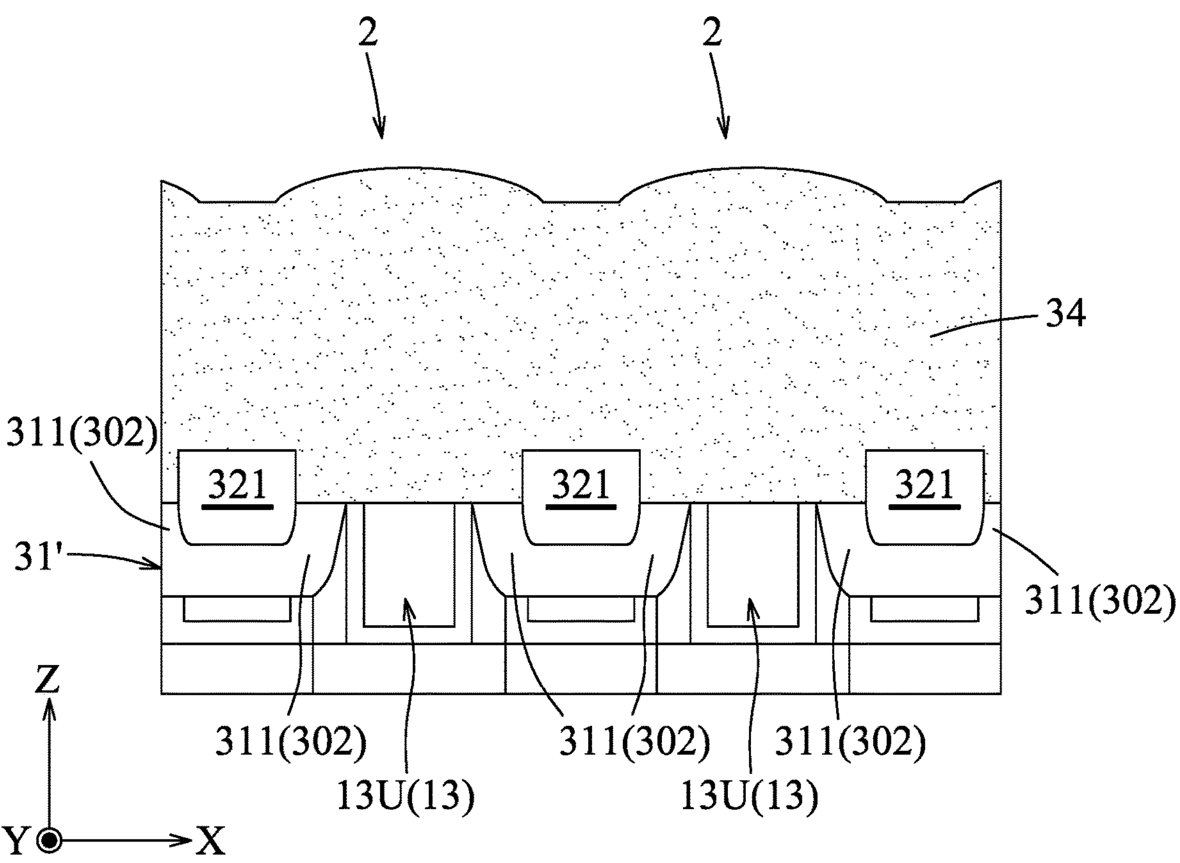

In sub-step SS5, a third dielectric layer 34 is formed on the structure obtained after sub-step SS4 (for example, but not limited to, the structures shown in FIGS. 11 to 13) by CVD, ALD, or other suitable deposition techniques such that the third dielectric layer 34 is formed over the upper gate portions 13U of the devices 2 and the first and second dielectric regions 311, 321, and fills the third grooves 33 and the trenches (not shown). It is noted that after sub-step SS5, the structure which is formed from the structure shown in FIG. 11 is shown in FIG. 14, and the structures respectively formed from the structures shown in FIGS. 12 and 13 are not illustrated for the sake of brevity. The third dielectric layer 34 is made of a material different from those of the first and second dielectric layers 31, 32, and thus for each of the devices 2, the second dielectric regions 321 may serve as a stop layer for a planarization process and/or an etching process to be subsequently performed. The third dielectric layer 34 may be made of silicon oxide, silicon nitride, silicon oxynitride, silicon carbonitride, silicon oxycarbide, silicon oxycarbonitride, silicon carbide, a suitable high-k material (such as the examples described in the preceding paragraph), or other suitable dielectric materials, and have a dielectric constant (k) ranging from about 6 to about 25, in some cases, from about 7 to about 25, in some cases, from about 8 to about 25, in some cases, from about 9 to about 25.

In sub-step SS6, the third dielectric layer 34 (see FIG. 14) is planarized to expose the second dielectric regions 321 such that for each of the devices 2, the planarized third dielectric layer 34 serves as the cap portion 301 of the insulating feature 30 and is located between the pair of the second dielectric regions 321. After sub-step SS6, the insulating features 30 of the first, second and third variants, respectively shown in FIGS. 15, 16, 17, are thus formed. It can be observed that the cap portion 301 of each of the devices 2 has a configuration correlated to that of the third groove 33 formed in sub-step SS4 (see FIGS. 11, 12 and 13). Other suitable processes for forming the insulating feature 30 are within the contemplated scope of the present disclosure.

FIGS. 18 to 20 are schematic cross-sectional views respectively illustrating the insulating feature 30 of each of the devices 2 along the Y direction in accordance with some embodiments. Since the trenches formed in sub-step SS4 (i.e., etching back of the first dielectric layer 31) may have a depth which is affected by a process time of the etching back process, the cap portion 301 of the insulating feature 30 of each of the devices 2 may have different configurations when the process time is varied (see FIGS. 18, 19 and 20). When the process time in sub-step SS4 is the first predetermined time period, the cap portion 301 of the insulating feature 30 in each of the devices 2 may cover the upper gate portion 13U, as shown in FIG. 19. When the process time in sub-step SS4 is the third predetermined time period, the cap portion 301 of the insulating feature 30 in each of the devices 2 may be spaced apart from the upper gate portion 13U, as shown in FIG. 18. When the process time in sub-step SS4 is the second predetermined time period, the cap portion 301 of the insulating feature 30 in each of the devices 2 may extend to cover the second lateral sides LS2 of the upper gate portion 13U, as shown in FIG. 20. For purposes of simplicity and clarity, in following steps, FIGS. 7 and 16 are further illustrated while FIGS. 15 and 17 are not further illustrated.

Figure 25:
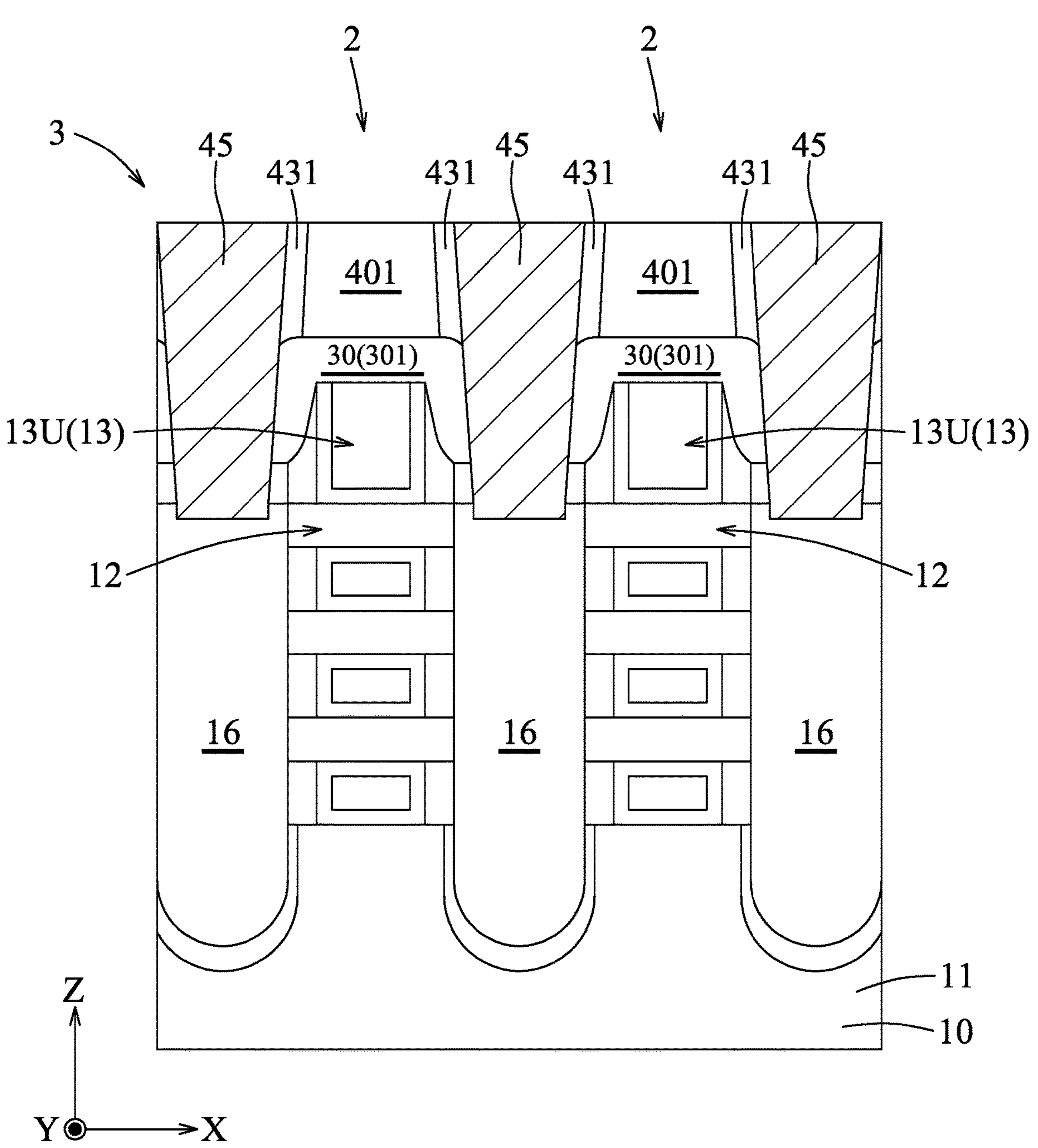
Figure 29:
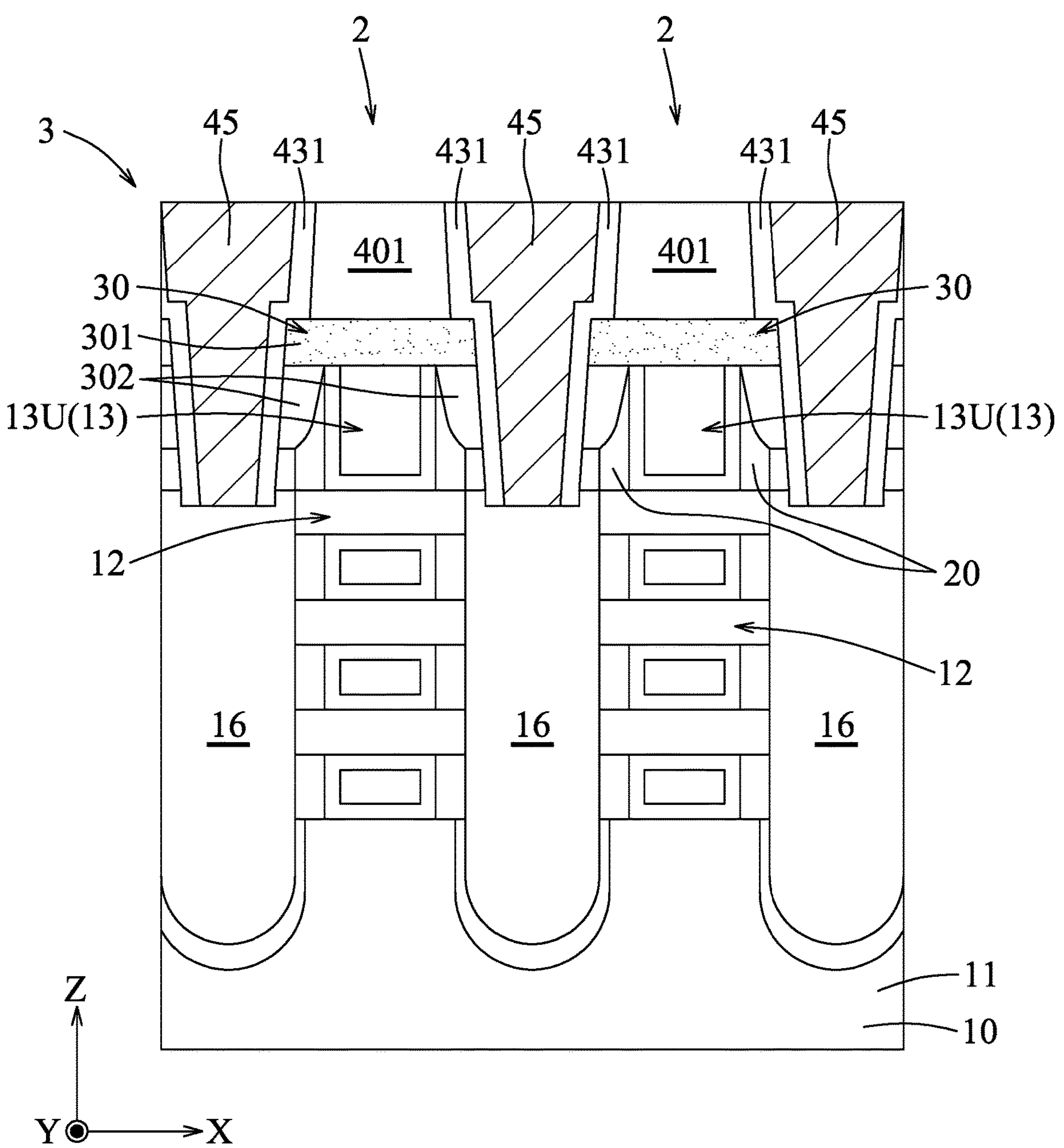

Referring to FIG. 1 and the examples illustrated in FIGS. 25 and 29, the method 100 proceeds to step S104, where a plurality of ILD portions 401, barrier features 431 and contact features 45 are formed. FIGS. 25 and 29 are views similar to those of FIGS. 7 and 16, respectively, but illustrating the structures after step S104. In addition, FIGS. 25 and 29 further illustrate the other elements omitted in FIGS. 7 and 16, respectively.

In some embodiments, for obtaining the structure shown in FIG. 25, step S104 may include sub-steps SS01 to SS05.

Figure 21:
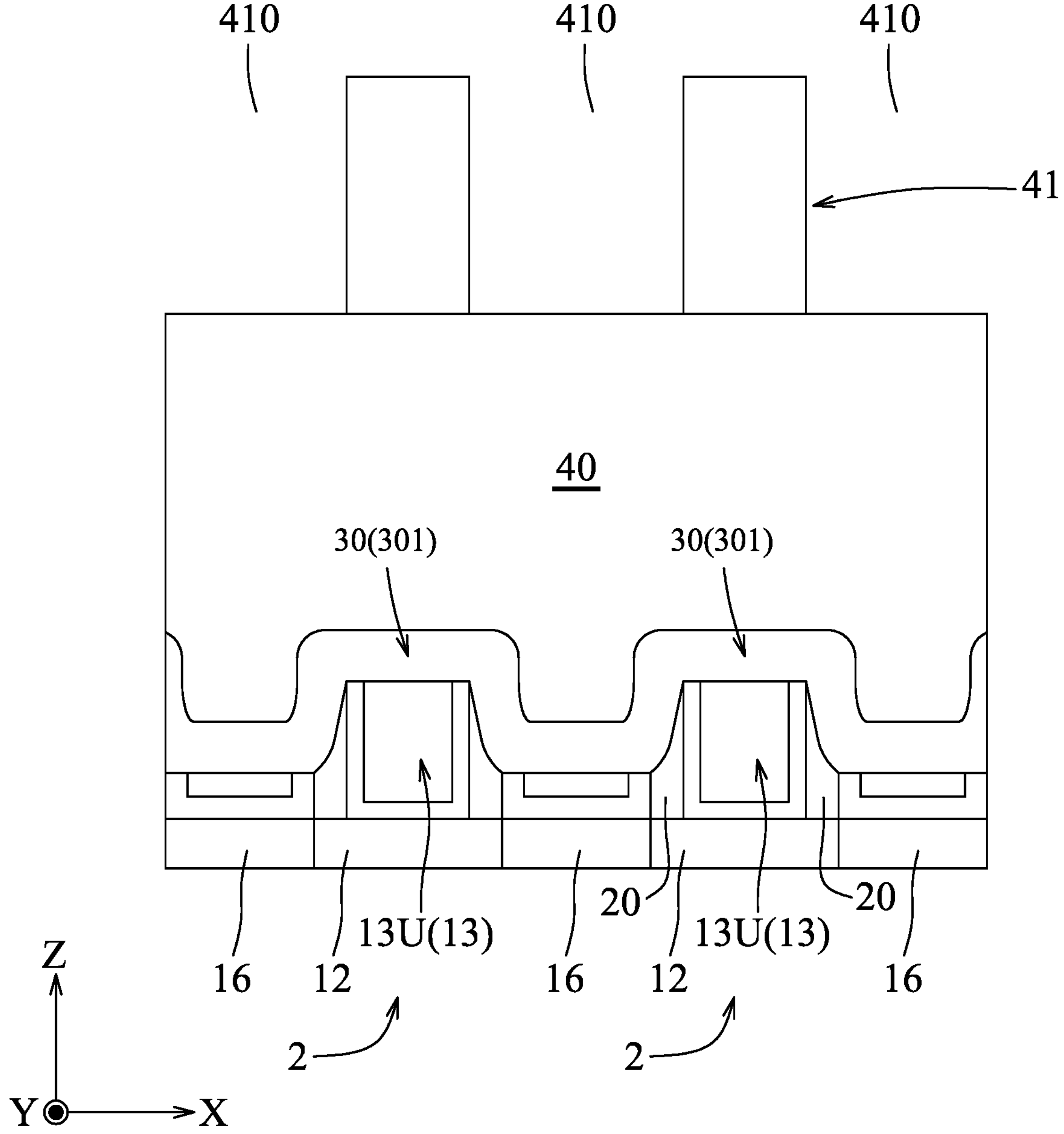

In sub-step SS01, as shown in FIG. 21, an ILD layer 40 is formed on the structure obtained after step S103 (for example, but not limited to, the structure shown in FIG. 7) by CVD, ALD, or other suitable deposition techniques, followed by a planarization process, for example, but not limited to, CMP, such that the ILD layer 40 has a flat upper surface. Afterwards, a patterned mask layer 41 having a plurality of openings 410 in positions respectively corresponding to the source/drain features 16 of the devices 2 is formed on the ILD layer 40. The patterned mask layer 41 is formed by depositing a material for forming the patterned mask layer 41 using CVD, ALD, or other suitable deposition techniques, followed by a photolithography process. In some embodiments, the ILD layer 40 may be made of a suitable low-k material (such as the examples described in the preceding paragraph) which is different from the dielectric material of the cap portion 301. In some embodiments, the patterned mask layer 41 may be configured as a single-layered structure or a multi-layer structure. In some embodiments, the patterned mask layer 41 may include a low-k material, a high-k material (such as the examples described in the preceding paragraph), a metal, or combinations thereof. Other suitable materials for the ILD layer 40 and the patterned mask layer 41 are within the contemplated scope of the present disclosure.

Figure 22:
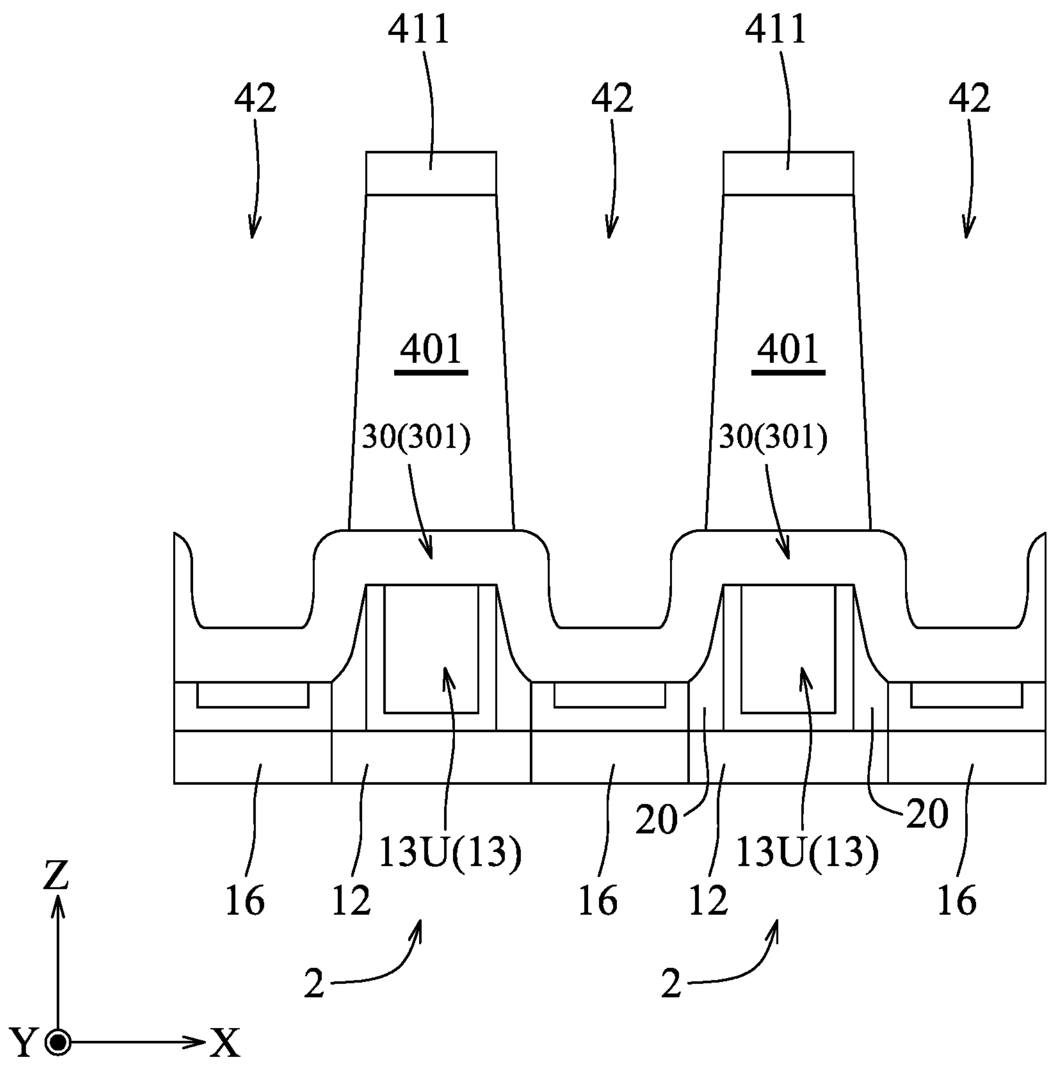

In sub-step SS02, as shown in FIG. 22, a plurality of contact recesses 42 are formed by etching the ILD layer 40 through the openings 410 of the patterned mask layer 41 shown in FIG. 21 using dry etching, wet etching, other suitable processes, or combinations thereof until the insulating features 30 of the devices 2 are exposed from the contact recesses 42. Since an etchant (for example, etching gas(es) used in a dry etching process and/or wet etchant(s) used in a wet etching process) has a relatively high etching selectivity to the ILD layer 40 relative to the insulating feature 30 of each of the devices 2, the insulating feature 30 is substantially not removed. After sub-step SS02, the ILD layer 40 is formed into the ILD portions 401, and the remaining patterned mask layer is denoted by numeral 411.

Figure 23:
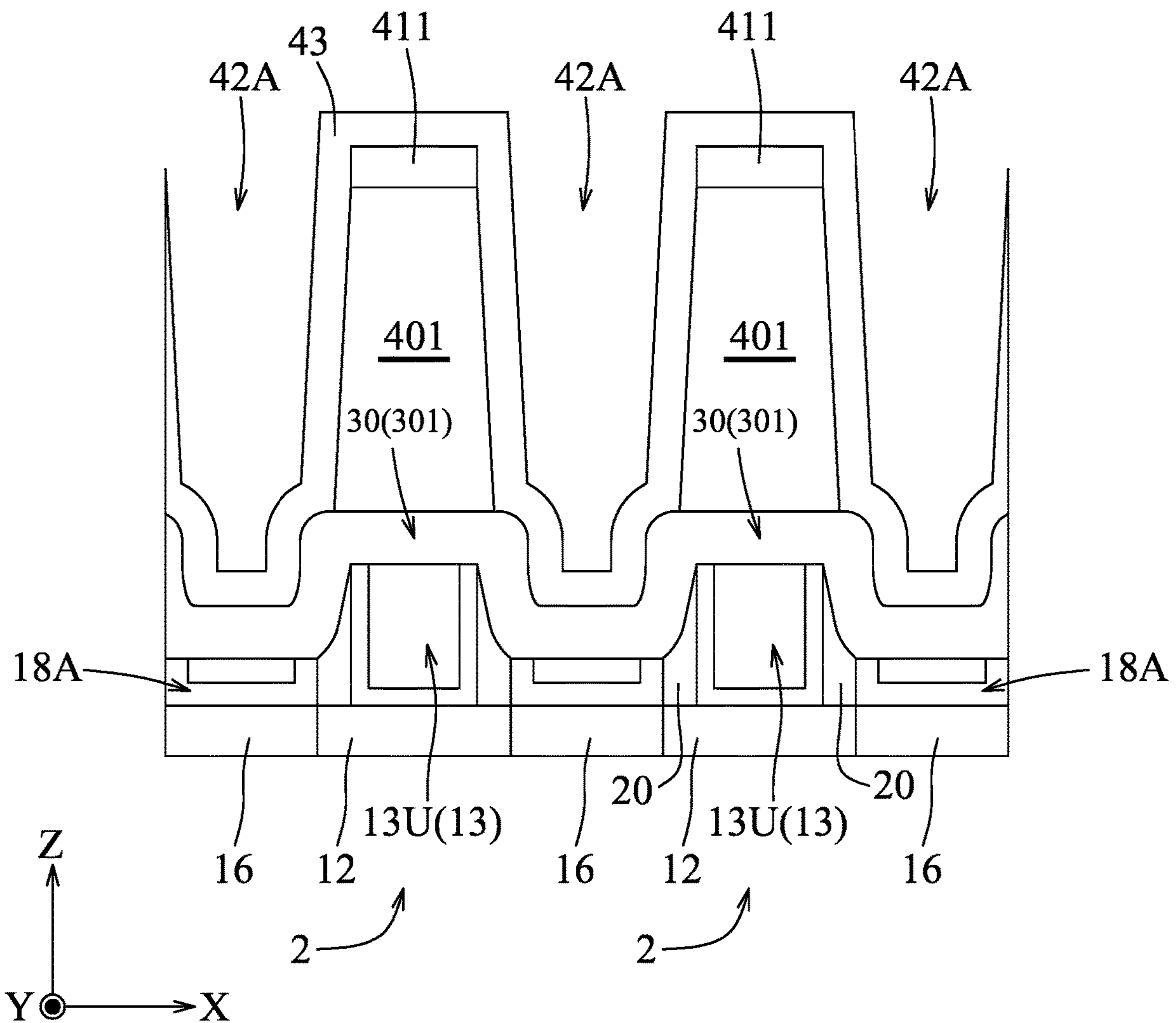

In sub-step SS03, as shown in FIG. 23, a barrier layer 43 is formed on the structure obtained after step SS02 (for example, but not limited to, the structure shown in FIG. 22) by CVD, ALD, or other suitable deposition techniques to further protect the upper gate portion 13U of each of the devices 2. In some embodiments, the barrier layer 43 may have a thickness ranging from about 3 nm to about 5 nm. Possible materials suitable for forming the barrier layer 43 may be similar to those for the cap portion 301 of the insulating feature 30 as described with reference to FIG. 7. In some embodiments, the barrier layer 43 may be made of a material the same as or different from that of the cap portion 301 of the insulating feature 30. After sub-step SS03, the remaining contact recesses are denoted by numeral 42A.

Figure 24:
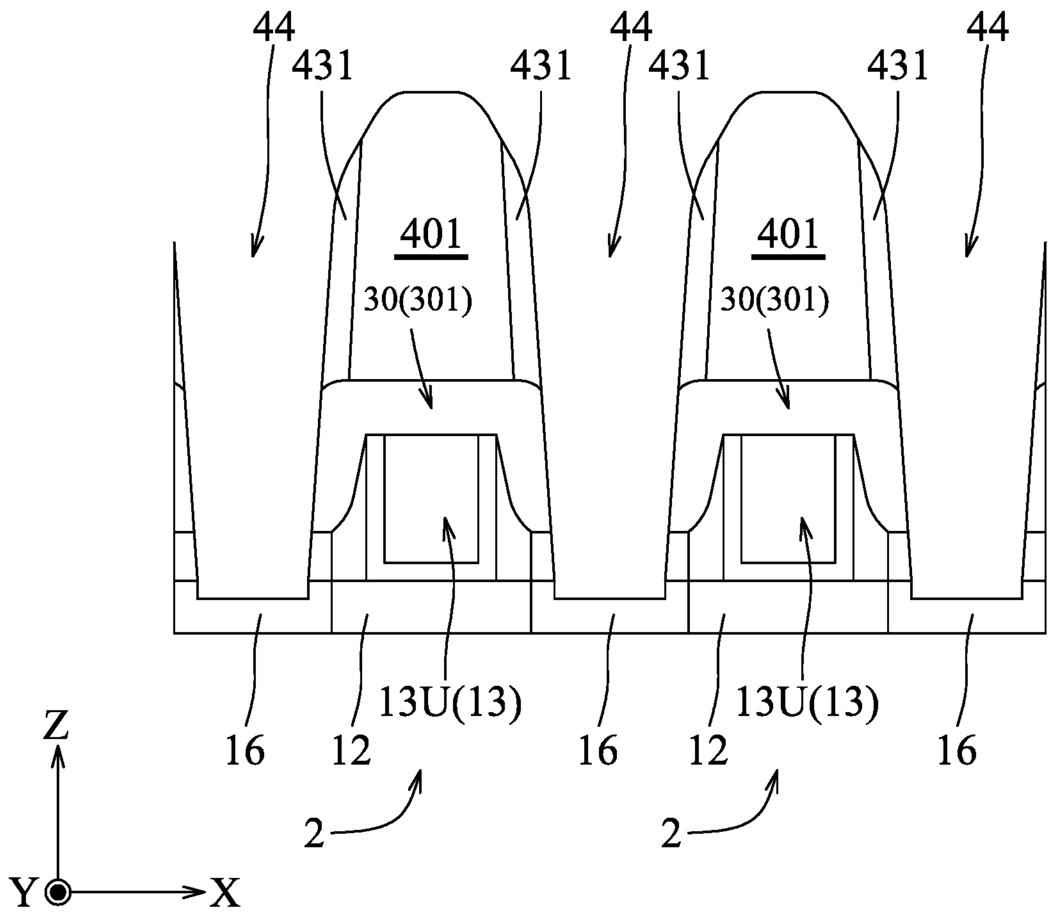

In sub-step SS04, as shown in FIG. 24, a plurality of contact holes 44 are formed by etching the barrier layer 43, the insulating features 30, and the remaining isolation portions 18A on the source/drain features 16 of the devices 2 (see FIG. 23) through the remaining contact recesses 42A using dry etching, wet etching, other suitable processes, or combinations thereof until the source/drain features 16 are exposed from the contact holes 44. After sub-step SS04, the barrier layer 43 is formed into a plurality pairs of the barrier features 431. For each of the devices 2, one pair of the barrier features 431 are disposed on the remaining insulating feature 30 and are each disposed to be kept away from a corresponding one of the source/drain features 16.

In sub-step SS05, as shown in FIG. 25, a material for forming the contact features 45 is formed to fill the contact holes 44 (see FIG. 24), followed by a planarization process, for example, but not limited to, CMP, to expose the ILD portions 401. In some embodiments, the material for forming the contact features 45 may include W, Ru, cobalt (Co), copper (Cu), molybdenum (Mo), or combinations thereof. Other suitable materials for the contact features 45 are within the contemplated scope of the present disclosure. After sub-step SS05, it is noted that for each of the devices 2, one of the ILD portions 401 is disposed on the insulating feature 30 and between two adjacent ones of the contact features 45, and each of the barrier features 431 is disposed between the one of the ILD portions 401 and a corresponding one of the contact features 45. Therefore, each of the barrier features 431 is used to prevent a diffusion of the material in the corresponding contact feature 45 into the one of the ILD portions 401. In some embodiments, before sub-step SS05, an etching process (which is referred to as a top corner rounding process hereinafter) may be performed so as to permit upper corners of the ILD portions 401 to be rounded, thereby facilitating filling of the material for the contact feature 45 in the contact holes 44. In some embodiments, before sub-step SS05, in order to reduce a source/drain contact resistance (Resd) between each of the contact features 45 and a corresponding one of the source/drain features 16, an implantation process (which is referred to as a segregation implantation process hereinafter) may be performed to implant suitable species (for example, but not limited to, boron elements for p-FETs and phosphorus elements for n-FETs) into an upper surface of each of the source/drain features 16, and/or a metal silicide layer may be formed between each of the contact features 45 and the corresponding source/drain feature 16.

In some other embodiments, for obtaining the structure shown in FIG. 29, step S104 may include sub-steps SS11 to SS13. It is noted that similar numerals from the above-mentioned embodiments are used where appropriate, with some construction differences being indicated with different numerals.

Figure 26:
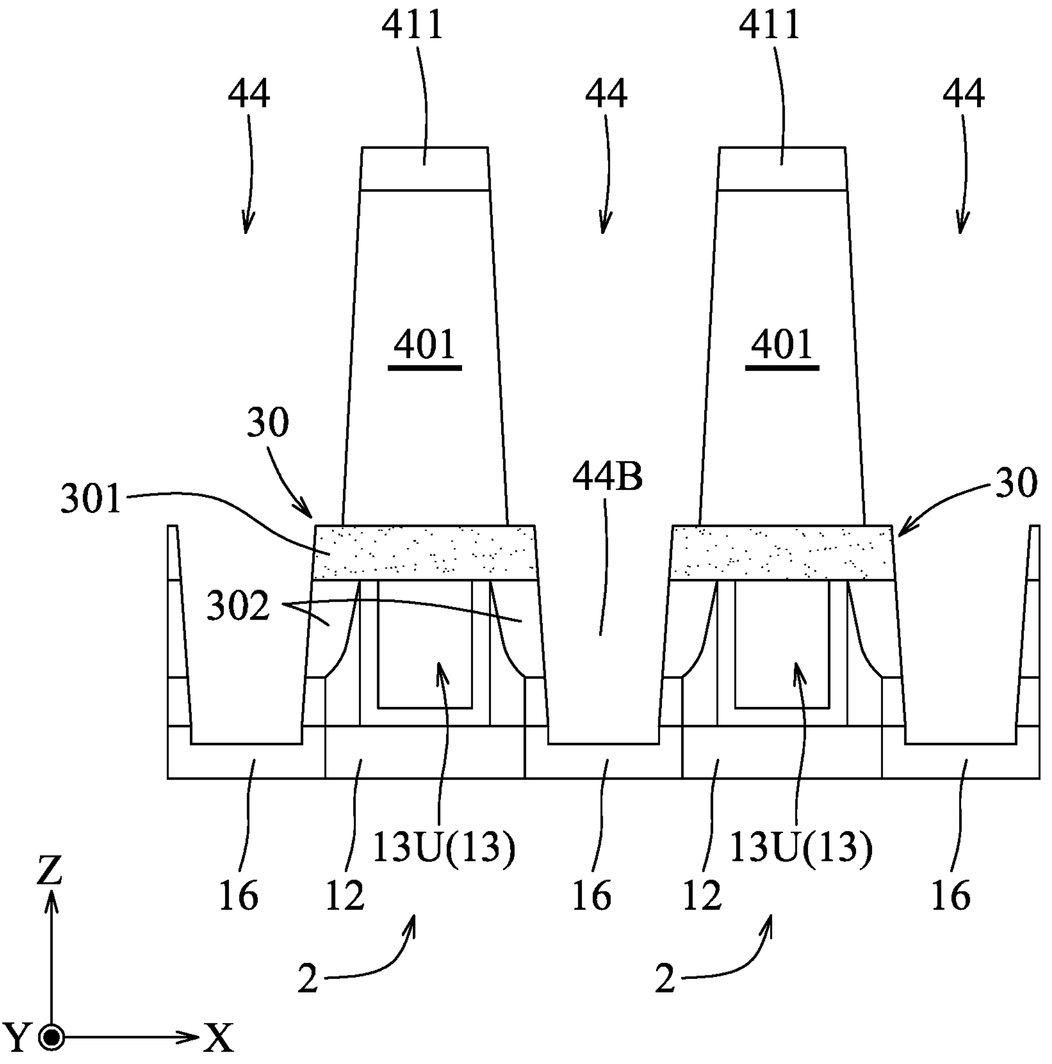
Figure 27:
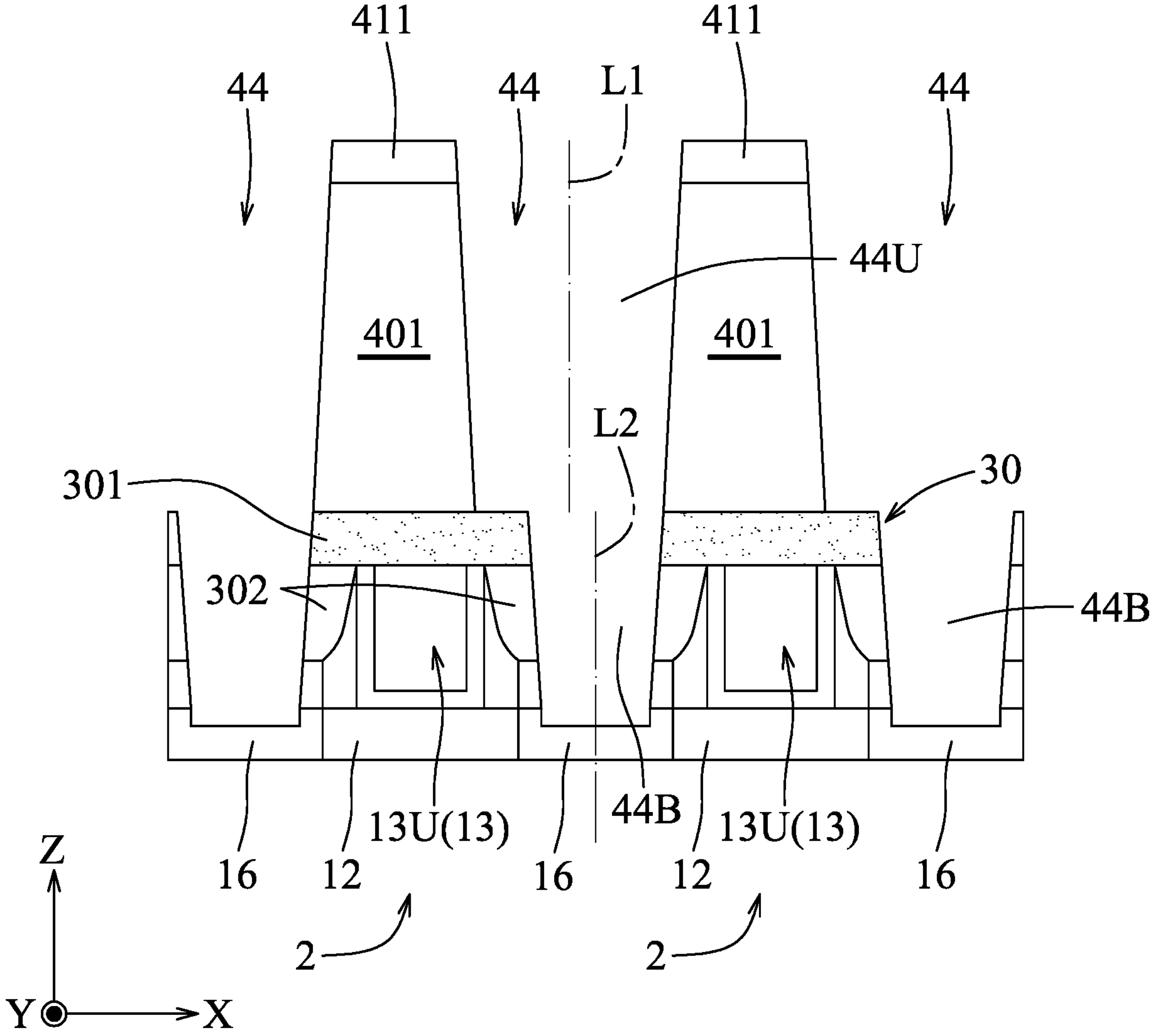

In sub-step SS11, as shown in FIG. 26, for each of the devices 2 having the second variant of the insulating feature 30 (see FIG. 16), the ILD portion 401 and the patterned mask layer 411 are formed in a way similar to sub-steps SS01 and SS02. In addition, a plurality of the contact holes 44 are each formed between the ILD portions 401 of two adjacent ones of the devices 2. It is noted that during patterning of the ILD layer 40 (see also FIG. 21) for forming the contact holes 44, the cap portion 301 of the insulating feature 30 in each of the devices 2 is substantially not damaged because an etchant has a relatively high etching selectivity to the ILD layer 40 (see also FIG. 21), the wall portions 302 of the insulating feature 30, and the remaining dielectric portions 18A (see also FIG. 16) relative to the cap portion 301 of the insulating feature 30. Accordingly, a lower portion 44B of each of the contact holes 44 may have a hole width in the X direction which is determined by a distance between the cap portions 301 of the insulating features 30 of two adjacent ones of the devices 2. FIG. 27 is a view similar to that of FIG. 26, but illustrating the structure when an overlay shift occurs during formation of the patterned mask layer 41 (see also FIG. 21). That is, each of the contact holes 44 has an upper portion 44U which has a bisecting line L1 in the Z direction not coincident with a bisecting line L2 of a corresponding one of the source/drain features 16. It is noted that although the overlay shift occurs, as long as the overlay shift is not too severe, the lower portion 44B of each of the contact holes 44 shown in FIG. 27 may have a hole width in the X direction which is substantially not be affected by the overlay shift, and which is substantially equal to that of the lower portion 44B of each of the contact holes 44 shown in FIG. 26. Therefore, each of the contact features 45 to be subsequently formed in a corresponding one of the contact holes 44 shown in FIG. 27 may have a contact resistance substantially not changed with respect to that of each of the contact features 45 to be subsequently formed in a corresponding one of the contact holes 44 shown in FIG. 26.

Figure 28:
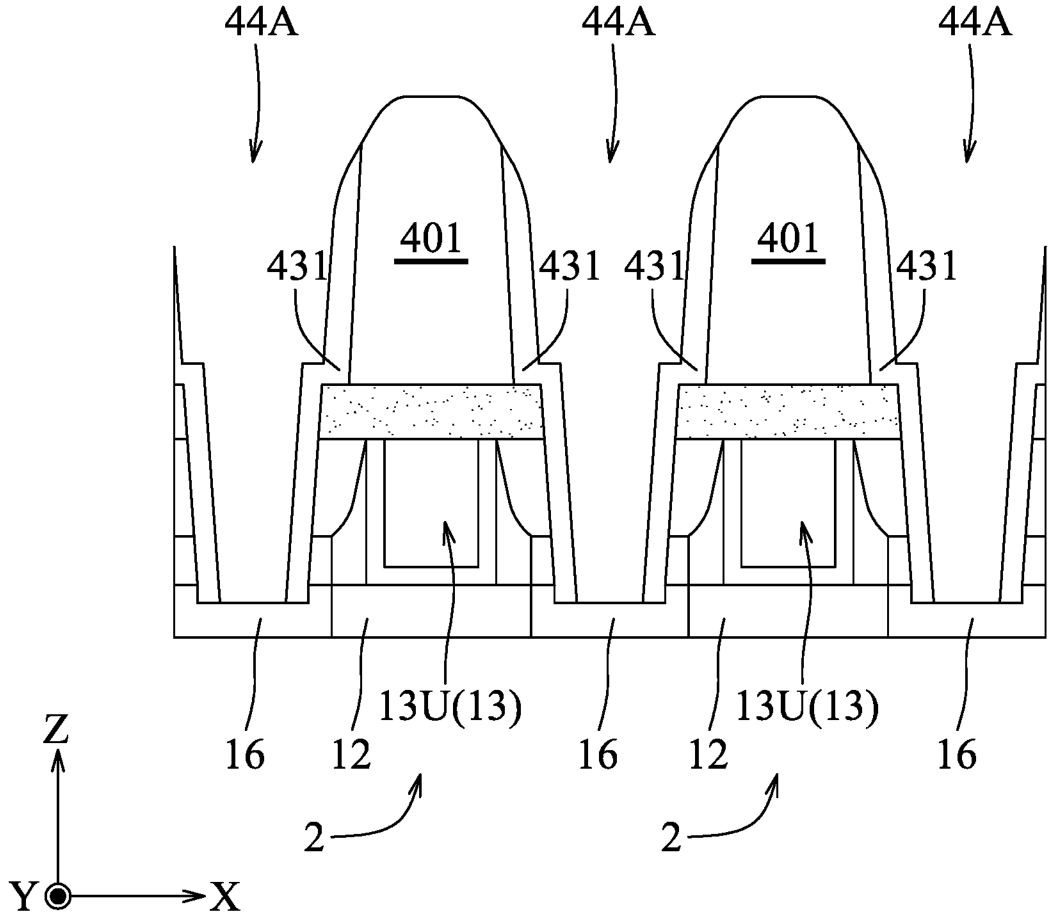

In sub-step SS12, as shown in FIG. 28, a barrier layer (not shown) for forming the barrier features 431 is formed on the structure obtained after step SS11 (for example, but not limited to, the structure shown in FIG. 26) by CVD, ALD, or other suitable deposition techniques, and then horizontal portions of the barrier layer on the source/drain features 16 and ILD portions 401 of the devices 2 are selectively removed using, for example, but not limited to, antistrophic etching, thereby leaving the barrier features 431 respectively on inner sidewall surfaces of the contact holes 44. After sub-step SS12, the remaining contact holes are denoted by numeral 44A.

In sub-step SS13, as shown in FIG. 29, a material for forming the contact features 45 is formed to fill the remaining contact holes 44A (see FIG. 28), followed by a planarization process, for example, but not limited to, CMP, to expose the ILD portions 401. It is noted that each of the barrier features 431 extends from one of the source/drain features 16 along a corresponding one of the insulating features 30 to be disposed between a corresponding one of the ILD portions 401 and a corresponding one of the contact features 45. In some embodiments, the top corner rounding process may be performed after sub-step SS12 and before sub-step SS13. In some embodiments, the segregation implantation process may be performed after sub-step SS12 and before sub-step SS13. In some embodiments, the top corner rounding process may be performed before or after the segregation implantation process. In some embodiments, a metal silicide layer may be formed between each of the contact features 45 and a corresponding source/drain feature 16.

In some embodiments, the semiconductor structure 3 may further include a plurality of interconnect layers each including an inter-metal dielectric (IMD) feature (not shown) in which electrically conductive elements (not shown, for example, metal contacts, metal lines and/or metal vias) are formed so as to permit the devices 2 to be electrically connected to external circuits through the electrically conductive elements. In some embodiments, the interconnect layers may be formed by a dual damascene process, a single damascene process, or other suitable back-end-of-line (BEOL) techniques.

In some embodiments, some steps in the method 100 may be modified, replaced, or eliminated without departure from the spirit and scope of the present disclosure. In some alternative embodiments, other suitable methods may also be applied for forming the semiconductor structure 3.

In this disclosure, for each of the devices, an upper part of the upper gate portion of the gate structure (MG) is well protected by the insulating feature during formation of the contact features (MD), and the ILD portion disposed on the insulating feature may reduce a parasitic capacitance generated between the contact features. Furthermore, by adjusting the combination of steps or process parameters during formation of the insulating feature, the cap portion of the insulating feature made from different materials and/or having different configurations may be obtained. When the cap portion of the insulating feature is made of a relatively high dielectric constant material, a contact resistance of each of the contact features is less likely to be affected by occurrence of an overlay shift between each of the contact features and a corresponding one of the source/drain features. Therefore, the method in this disclosure provides a flexible strategy capable of obtaining the semiconductor structure which is formed with fewer MG-MD bridging defects and which has a stable contact resistance under normal process variation.

In accordance with some embodiments of the present disclosure, a semiconductor structure includes a substrate, a channel structure, a gate structure, two gate spacers, and an insulating feature. The channel structure is disposed on the substrate, and has an uppermost surface opposite to the substrate. The gate structure is disposed on the channel structure, and includes a gate electrode and a gate dielectric layer which is disposed to separate the channel structure from the gate electrode. The gate structure including an upper gate portion which is located at a level higher than that of the uppermost surface of the channel structure. The two gate spacers are respectively located at two opposite sides of the upper gate portion. Each of the gate spacers has an upward surface which has a concave profile, and which faces away from the substrate. The insulating feature is disposed over the upper gate portion and against the concave profiles of the gate spacers such that the insulating feature has an inverted U-shaped profile. The insulating feature includes a cap portion which is made of a dielectric material different from that of each of the gate spacers, and which is disposed on an upper surface of the upper gate portion and extends beyond an edge of the upper surface of the upper gate portion.

In accordance with some embodiments of the present disclosure, each of the gate spacers further has a first lateral surface facing away the upper gate portion, and a second lateral surface opposite to the first lateral surface and confronting the upper gate portion. The upward surface has a first juncture with the first lateral surface and a second juncture with the second lateral surface. The first juncture is more proximate to the substrate than the second juncture.

In accordance with some embodiments of the present disclosure, the cap portion has two end regions which are respectively disposed at the two opposite sides of the upper gate portion. Each of the end regions is spaced apart from the first juncture of a corresponding one of the gate spacers.

In accordance with some embodiments of the present disclosure, the cap portion has a dielectric constant (k) ranging from 6 to 25.

In accordance with some embodiments of the present disclosure, the cap portion has a bottommost surface which is at a level not lower than that of the upper surface of the upper gate portion.

In accordance with some embodiments of the present disclosure, the cap portion of the insulating feature includes a main region which covers the upper surface of the upper gate portion, and two end regions which extend oppositely from the main region and which are disposed above the gate spacers, respectively. The insulating feature further includes two wall portions, each of which extends from one of the end regions to cover a corresponding one of the gate spacers. Each of the wall portions is made of a dielectric material different from that of the cap portion.

In accordance with some embodiments of the present disclosure, the cap portion of the insulating feature includes a main region which covers the upper surface of the upper gate portion, and two end regions which extend oppositely from the main region toward the gate spacers, respectively, and which are respectively disposed at the two opposite sides of the upper gate portion.

In accordance with some embodiments of the present disclosure, the cap portion has a dielectric constant (k) ranging from 4.5 to 7, and each of the end regions extends to cover the first juncture of a corresponding one of the gate spacers.

In accordance with some embodiments of the present disclosure, a semiconductor structure includes a substrate, a channel structure, a gate structure, two gate spacers, and an insulating feature. The channel structure is disposed on the substrate, and has an uppermost surface opposite to the substrate. The gate structure is disposed on the channel structure, and includes a gate electrode and a gate dielectric layer which is disposed to separate the channel structure from the gate electrode. The gate structure is elongated in a Y direction, and includes an upper gate portion which is located at a level higher than that of the uppermost surface of the channel structure. The two gate spacers are respectively located at two first lateral sides of the upper gate portion that are opposite to each other in an X direction transverse to the Y direction. Each of the gate spacers has an upward surface which has a concave profile, and which faces away from the substrate. The insulating feature is disposed over the upper gate portion and against the concave profiles of the gate spacers such that the insulating feature has an inverted U-shaped profile. The insulating feature includes a cap portion which is made of a dielectric material different from that of each of the gate spacers, and which is disposed on the upper gate portion and extends beyond the first lateral sides of the upper gate portion.

In accordance with some embodiments of the present disclosure, the upper gate portion further has two second lateral sides opposite to each other in the Y direction. The cap portion further extends beyond the second lateral sides of the upper gate portion.

In accordance with some embodiments of the present disclosure, the semiconductor structure further includes two source/drain features, two contact features, an inter-layer dielectric portion, and two barrier features. The source/drain features are respectively disposed at two opposite sides of the channel structure and are spaced apart from each other in the X direction. The two contact features are respectively disposed on the source/drain features. The ILD portion is disposed on the insulating feature and between the contact features, and the ILD portion is made of a dielectric material different from that of the cap portion. Each of the two barrier features is disposed to prevent diffusion of a material in a corresponding one of the contact features into the ILD portion.

In accordance with some embodiments of the present disclosure, each of the barrier features is disposed on the insulating feature and between the ILD portion and the corresponding one of the contact features. Each of the barrier features is disposed to be kept away from a corresponding one of the source/drain features.

In accordance with some embodiments of the present disclosure, each of the barrier features extends from one of the source/drain features along the insulating feature, and is disposed between the ILD portion and a corresponding one of the contact features.

In accordance with some embodiments of the present disclosure, a method for manufacturing a semiconductor structure includes: forming a channel structure on a substrate, the channel structure having an uppermost surface opposite to the substrate; forming a gate structure on the channel feature, the gate structure including a gate electrode and a gate dielectric layer disposed to separate the channel structure from the gate electrode, the gate structure including an upper gate portion which is located at a level higher than that of the uppermost surface of the channel structure; forming two gate spacers respectively at two opposite sides of the upper gate portion, each of the gate spacers having an upward surface which has a concave profile, and which faces away from the substrate; and forming an insulating feature disposed over the upper gate portion and against the concave profiles of the gate spacers such that the insulating feature has an inverted U-shaped profile, the insulating feature including a cap portion which is made of a dielectric material different from that of each of the gate spacers, the cap portion being formed on an upper surface of the upper gate portion and extending beyond an edge of the upper surface of the upper gate portion.

In accordance with some embodiments of the present disclosure, forming the gate spacers includes forming two gate sidewalls and recessing the gate sidewalls to form the gate spacers, respectively. The two gate sidewalls are respectively formed at the two opposite sides of the upper gate portion. A lowest point on the upward surface of each of the gate spacers is the furthest point away from the upper gate portion.

In accordance with some embodiments of the present disclosure, the lowest point is at a level lower than a half of a height of the upper gate portion.

In accordance with some embodiments of the present disclosure, the cap portion is formed on the upper gate portion and the gate spacers, and the dielectric material of the cap portion has a dielectric constant (k) that is greater than that of each of the gate spacers.

In accordance with some embodiments of the present disclosure, forming the insulating feature includes: forming a first dielectric layer over the upper gate portion and the gate spacers; forming a second dielectric layer over the first dielectric layer, the second dielectric layer being made of a material different from that of the first dielectric layer; planarizing the second dielectric layer to expose the first dielectric layer such that the planarized second dielectric layer has two second dielectric regions respectively formed at the two opposite sides of the upper gate portion; etching back the first dielectric layer such that the etched first dielectric layer has two first dielectric regions which are respectively formed at the two opposite sides of the upper gate portion, and which are recessed relative to the second dielectric regions, the first dielectric regions serving as two wall portions of the insulating feature, respectively; forming a third dielectric layer over the upper gate portion and the first and second dielectric regions, the third dielectric layer being made of a material different from those of the first and second dielectric layers; and planarizing the third dielectric layer to expose the second dielectric regions, such that the planarized third dielectric layer, which is located between the second dielectric regions, serves as the cap portion of the insulating feature.

In accordance with some embodiments of the present disclosure, the upper surface of the upper gate portion is exposed after etching back the first dielectric layer. Each of the wall portions has an upper surface flush with the upper surface of the upper gate portion.

In accordance with some embodiments of the present disclosure, the upper surface of the upper gate portion is exposed after etching back the first dielectric layer. Each of the wall portions has an upper surface which is recessed relative to the upper surface of the upper gate portion.

In accordance with some embodiments of the present disclosure, the method further includes forming two source/drain features respectively at two opposite sides of the channel structure, forming two contact features respectively on the source/drain features, forming an inter-layer dielectric (ILD) portion on the insulating feature and between the contact features, and forming two barrier features, each of which is disposed to prevent diffusion of a material in a corresponding one of the contact features into the ILD portion.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a channel structure on a substrate, the channel structure having an uppermost surface opposite to the substrate;

forming a gate structure on the channel structure, the gate structure including a gate electrode and a gate dielectric layer disposed to separate the channel structure from the gate electrode, an upper gate portion of the gate structure being located at a level higher than a level of the uppermost surface of the channel structure;

forming two gate spacers respectively at two opposite sides of the upper gate portion, each of the two gate spacers having an upward surface which has a concave profile, and which faces away from the substrate; and forming an insulating feature over the upper gate portion and against the upward surface of each of the two gate spacers such that the insulating feature has an inverted U-shaped profile, the insulating feature including a cap portion which is made of a dielectric material different from a dielectric material of each of the two gate spacers, the cap portion being formed on an upper surface of the upper gate portion and extending beyond an edge of the upper surface of the upper gate portion, wherein forming the insulating feature includes:

forming a first dielectric layer over the upper gate portion and the two gate spacers;

forming a second dielectric layer over the first dielectric layer, the second dielectric layer being made of a material different from a material of the first dielectric layer;

planarizing the second dielectric layer to expose the first dielectric layer such that the second dielectric layer is formed into two second dielectric regions respectively located at the two opposite sides of the upper gate portion;

etching back the first dielectric layer such that the first dielectric layer is formed into two first dielectric regions which are respectively located at the two opposite sides of the upper gate portion, and which are recessed relative to the two second dielectric regions, the two first dielectric regions respectively serving as two wall portions of the insulating feature;

forming a third dielectric layer over the upper gate portion, the two first dielectric regions and the two second dielectric regions, the third dielectric layer being made of a material different from the material of the first dielectric layer and the material of the second dielectric layer; and planarizing the third dielectric layer to expose the two second dielectric regions, such that the third dielectric layer is formed into the cap portion of the insulating feature which is located between the two second dielectric regions.

2. The method of claim 1, wherein forming the two gate spacers includes forming two gate sidewalls respectively at the two opposite sides of the upper gate portion, and recessing the two gate sidewalls to respectively form the two gate spacers, such that a lowest point on the upward surface of each of the two gate spacers is the furthest point away from the upper gate portion.

3. The method of claim 1, wherein the cap portion is formed on the upper gate portion and the two gate spacers, the cap portion having a dielectric constant that is greater than a dielectric constant of each of the two gate spacers.

4. The method of claim 1, wherein the upper surface of the upper gate portion is exposed after etching back the first dielectric layer, and each of the two wall portions has an upper surface that is flush with the upper surface of the upper gate portion.

5. The method of claim 1, wherein the upper surface of the upper gate portion is exposed after etching back the first dielectric layer, and each of the two wall portions has an upper surface which is recessed relative to the upper surface of the upper gate portion.

6. The method of claim 3, further comprising:

forming two source/drain features respectively at two opposite sides of the channel structure;

forming two contact features respectively on the two source/drain features;

forming an inter-layer dielectric portion on the insulating feature and between the two contact features; and forming two barrier features, each of which is disposed to prevent diffusion of a material in a corresponding one of the two contact features into the inter-layer dielectric portion.

7. A method for manufacturing a semiconductor structure, comprising:

forming a patterned structure on a substrate, the patterned structure including a channel structure disposed on the substrate and having an uppermost surface distal from the substrate, a gate structure disposed on the channel structure, an upper gate portion of the gate structure being located at a level higher than a level of the uppermost surface of the channel structure, two gate spacers respectively located at two opposite sides of the upper gate portion, two source/drain features disposed on the substrate and respectively located at two opposite sides of the channel structure, a contact etch stop layer disposed on the two source/drain features and extending along sidewalls of the two gate spacers, and an inter-layer dielectric layer disposed on the contact etch stop layer;

performing a recessing process on the two gate spacers, the contact etch stop layer and the inter-layer dielectric layer to form two first grooves respectively at the two opposite sides of the upper gate portion;

after the recessing process, forming a first dielectric layer over the upper gate portion and along an inner surface of each of the two first grooves, the first dielectric layer being made of a material different from a material of each of the two gate spacers, the first dielectric layer includes two horizontal portions respectively disposed above the two source/drain features, and an inverted U-shaped portion which covers the upper gate portion and which has two ends respectively connected to the two horizontal portions;

forming a second dielectric layer on the first dielectric layer to fill two caves, each of which is defined by the inverted U-shaped portion and a corresponding one of the two horizontal portions, the second dielectric layer being made of a material different from a material of the first dielectric layer; and planarizing the second dielectric layer to expose the inverted U-shaped portion of the first dielectric layer, such that the second dielectric layer is formed into two second dielectric regions which are respectively formed on the two horizontal portions of the first dielectric layer.

8. The method of claim 7, wherein after the recessing process, each of the two gate spacers has an upward surface that faces away from the substrate and that has a concave profile.

9. The method of claim 7, wherein after the recessing process, each of the two gate spacers has a first lateral surface facing away the upper gate portion, and a second lateral surface that is opposite to the first lateral surface and that confronts the upper gate portion, and an upward surface facing away from the substrate, the upward surface having a first juncture with the first lateral surface and a second juncture with the second lateral surface, the first juncture being more proximate to the substrate than the second juncture.

10. The method of claim 7, wherein a dielectric constant of the first dielectric layer is greater than a dielectric constant of the two gate spacers.

11. The method of claim 7, wherein a depth of the two grooves is less than a height of the upper gate portion.

12. The method of claim 7, further comprising:

etching back the inverted U-shaped portion of the first dielectric layer to form a second groove;

forming a third dielectric layer to fill the second groove, the third dielectric layer being made of a material different from the material of the first dielectric layer and the material of the second dielectric layer.

13. The method of claim 12, wherein a dielectric constant of the third dielectric layer is greater than a dielectric constant of the first dielectric layer.

14. The method of claim 12, wherein the inverted U-shaped portion of the first dielectric layer is etched back such that the upper gate portion is exposed to the second groove.

15. The method of claim 14, wherein the inverted U-shaped portion of the first dielectric layer is etched back such that the two gate spacers are partially exposed to the second groove.

16. A method for manufacturing a semiconductor structure, comprising:

forming a patterned structure on a substrate, the patterned structure including two channel structures disposed on the substrate, each of the two channel structures having an uppermost surface distal from the substrate, two gate structures respectively disposed on the two channel structures and elongated in a first direction, each of the two gate structures interfacing at least three surfaces of a corresponding one of the two channel structures and having an upper gate portion which is located at a level higher than a level of the uppermost surface of the corresponding one of the two channel structures, two gate spacers respectively located at two first lateral sides of the upper gate portion of each of the two gate structures, the two first lateral sides being opposite to each other in a second direction different from the first direction, a gate isolation disposed between the two gate structures to separate the two gate structures from each other along the first direction, two source/drain features disposed on the substrate and respectively located at two opposite sides of each of the two channel structures in the second direction, and two inter-layer dielectric layers respectively disposed on the two source/drain features, each of the two inter-layer dielectric layers being separated from the upper gate portion of each of the two gate structures by a corresponding one of the two gate spacers;

performing an recessing process on the two gate spacers, the two inter-layer dielectric layers and the gate isolation to form two first grooves respectively at the two first lateral sides of the upper gate portion of each of the two gate structures, and a second groove between the upper gate portion of one of the two gate structures and the upper gate portion of the other of the two gate structures; and after the recessing process, forming a first dielectric layer over the upper gate portion of each of the two gate structures, the first dielectric layer extending along an inner surface of each of the two first grooves to cover the two gate spacers and the two inter-layer dielectric layers, and extending along an inner surface of the second groove to cover the gate isolation.

17. The method of claim 16, wherein a depth of the second groove is greater than a depth of the two first grooves.

18. The method of claim 16, wherein the first dielectric layer includes an inverted U-shaped portion which covers the upper gate portion of each of the two gate structures, two horizontal portions which are respectively disposed above the two source/drain features and which are respectively connected to two ends of the inverted U-shaped portion that are opposite to each other in the second direction, and a filling portion which is disposed on the gate isolation and which is connected to the inverted U-shaped portion, the method further comprises:

forming a second dielectric layer on the first dielectric layer to fill two caves, each of which is defined by the inverted U-shaped portion and a corresponding one of the two horizontal portions, the second dielectric layer being made of a material different from a material of the first dielectric layer; and planarizing the second dielectric layer to expose the inverted U-shaped portion and the filling portion of the first dielectric layer, such that the second dielectric layer is formed into two second dielectric regions which are respectively formed on the two horizontal portions of the first dielectric layer.

19. The method of claim 18, further comprising:

etching back the inverted U-shaped portion and the filling portion of the first dielectric layer to form a third groove;

forming a third dielectric layer to fill the third groove, the third dielectric layer being made of a material different from the material of the first dielectric layer and the material of the second dielectric layer.

20. The method of claim 19, wherein a dielectric constant of the third dielectric layer is greater than a dielectric constant of the first dielectric layer.

* * * * *